US012604686B2

(12) United States Patent     (10) Patent No.:   US 12,604,686 B2

Kim et al.     (45) Date of Patent:    Apr. 14, 2026

(54) SEMICONDUCTOR CHIP AND SEMICONDUCTOR PACKAGE INCLUDING THE SAME

(71) Applicant: SAMSUNG ELECTRONICS CO., LTD., Suwon-si (KR)

(72) Inventors: Yongho Kim, Suwon-si (KR); Jeonghoon Ahn, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 407 days.

(21) Appl. No.: 18/135,927

(22) Filed: Apr. 18, 2023

(65)       Prior Publication Data

US 2024/0055378 A1     Feb. 15, 2024

(30)      Foreign Application Priority Data

Aug. 9, 2022    (KR) ......................... 10-2022-0099431

(51) Int. Cl.
    *H01L 23/00*      (2006.01)
    *H01L 21/02*      (2006.01)
           (Continued)

(52) U.S. Cl.
    CPC ........ *H01L 24/08* (2013.01); *H01L 21/02164* (2013.01); *H01L 21/0217* (2013.01); (Continued)

(58) Field of Classification Search
    CPC ............... H01L 24/08; H01L 21/02164; H01L 21/0217; H01L 21/76897; H01L 21/76898; H01L 25/0657; H01L 25/18; H01L 2224/08145; H01L 23/5383; H01L 2225/06586; H01L 2225/1023; H01L 2225/1035; H01L 2225/1041; H01L 2224/80895; H01L 2224/80896; H01L 2225/1058; H01L 24/80; H01L 25/105; H01L 2225/06513; H01L 24/03; H01L 2225/06541; H01L 24/05; H01L 25/50; H01L 23/481; H01L 2224/05009; H01L 2224/05016; H01L 2224/05025; H01L 2224/05082

See application file for complete search history.

(56)        References Cited

U.S. PATENT DOCUMENTS 9,087,821   B2    7/2015   Lin
9,142,517   B2    9/2015   Liu et al.
                  (Continued)

FOREIGN PATENT DOCUMENTS

JP         6773884 B2    10/2020

*Primary Examiner* — Patricia D Valenzuela
(74) *Attorney, Agent, or Firm* — Muir Patent Law, PLLC

(57)          ABSTRACT

A semiconductor chip and a semiconductor package, the semiconductor chip includes a semiconductor substrate; a through electrode penetrating the semiconductor substrate; a bonding pad including a first conductive pad connected to the through electrode, and a second conductive pad on a central portion of the first conductive pad, an outer portion of the first conductive pad protruding outwardly relative to a sidewall of the second conductive pad; and a pad insulating layer on the semiconductor substrate and surrounding a sidewall of the first conductive pad and the sidewall of the second conductive pad.

18 Claims, 22 Drawing Sheets

(51) Int. Cl.
  *H01L 21/768*  (2006.01)
  *H01L 25/065*  (2023.01)
  *H01L 25/18*  (2023.01)

(52) U.S. Cl.
  CPC .. *H01L 21/76897* (2013.01); *H01L 21/76898* (2013.01); *H01L 25/0657* (2013.01); *H01L 25/18* (2013.01); *H01L 2224/08145* (2013.01)

(56) References Cited

U.S. PATENT DOCUMENTS

| | | | |
|---|---|---|---|
| 9,461,007 B2 | 10/2016 | Chun et al. | |
| 9,620,481 B2 | 4/2017 | Edelstein et al. | |
| 9,842,816 B2 | 12/2017 | Chen et al. | |
| 10,847,661 B2 | 11/2020 | Sato | |
| 11,069,637 B2 | 7/2021 | Kameshima | |
| 11,127,711 B2 | 9/2021 | Shini | |
| 2014/0117546 A1* | 5/2014 | Liu | H01L 25/0657 |
| | | | 438/669 |
| 2015/0021785 A1* | 1/2015 | Lin | H01L 21/76897 |
| | | | 438/459 |

* cited by examiner

VIB

VIA

391

330 340

240

230 240

340

330

391 330

300

300

810

300

319

300

317
217

219

200

SEMICONDUCTOR CHIP AND SEMICONDUCTOR PACKAGE INCLUDING THE SAME

CROSS-REFERENCE TO RELATED APPLICATIONS

This application is based on and claims priority under 35 U.S.C. § 119 to Korean Patent Application No. 10-2022-0099431, filed on Aug. 9, 2022, in the Korean Intellectual Property Office, the disclosure of which is incorporated by reference herein in its entirety.

BACKGROUND

1. Field

Embodiments relate to a semiconductor chip and a semiconductor package including stacked semiconductor chips.

2. Description of the Related Art

To meet the need for miniaturized, multifunctional, and high-performance electronic products, semiconductor packages may be highly integrated and may have a high speed. Accordingly, semiconductor packages including stacked semiconductor chips have been considered.

SUMMARY

The embodiments may be realized by providing a semiconductor chip including a semiconductor substrate; a through electrode penetrating the semiconductor substrate; a bonding pad including a first conductive pad connected to the through electrode, and a second conductive pad on a central portion of the first conductive pad, an outer portion of the first conductive pad protruding outwardly relative to a sidewall of the second conductive pad; and a pad insulating layer on the semiconductor substrate and surrounding a sidewall of the first conductive pad and the sidewall of the second conductive pad.

The embodiments may be realized by providing a semiconductor package including a first semiconductor substrate including a first surface and a second surface, which are opposite to each other; a first through electrode penetrating the first semiconductor substrate; a first bonding pad including a first conductive pad on the first surface of the first semiconductor substrate and connected to the first through electrode, and a second conductive pad on a central portion of the first conductive pad, an outer portion of the first conductive pad protruding outwardly relative to a sidewall of the second conductive pad; a first pad insulating layer on the first surface of the first semiconductor substrate and surrounding a sidewall of the first conductive pad and the sidewall of the second conductive pad; a second semiconductor substrate on the first pad insulating layer; a second through electrode penetrating the second semiconductor substrate; a second bonding pad bonded to the first bonding pad and electrically connecting the second through electrode to the first bonding pad; and a second pad insulating layer between the second semiconductor substrate and the first pad insulating layer and surrounding a sidewall of the second bonding pad.

The embodiments may be realized by providing a semiconductor package comprising a first semiconductor chip and a second semiconductor chip, which are bonded to each other, wherein the first semiconductor chip includes a first semiconductor substrate including a first surface and a second surface, which are opposite to each other; a first through electrode penetrating the first semiconductor substrate; a first bonding pad including a first conductive pad on the first surface of the first semiconductor substrate and connected to the first through electrode, and a second conductive pad on a central portion of the first conductive pad, an outer portion of the first conductive pad protruding outwardly relative to a sidewall of the second conductive pad; and a first pad insulating layer on the first surface of the first semiconductor substrate and surrounding a sidewall of the first conductive pad and the sidewall of the second conductive pad, the second semiconductor chip includes a second semiconductor substrate; a second through electrode penetrating the second semiconductor substrate; a second bonding pad bonded to the first bonding pad and including a third conductive pad connected to the second through electrode, and a fourth conductive pad between the third conductive pad and the second conductive pad, an outer portion of the third conductive pad protruding outwardly relative to a sidewall of the fourth conductive pad; and a second pad insulating layer between the second semiconductor substrate and the first pad insulating layer and surrounding a sidewall of the second bonding pad, the outer portion of the first conductive pad has a ring shape continuously extending around the sidewall of the second conductive pad in a plan view, the outer portion of the third conductive pad has a ring shape continuously extending around the sidewall of the fourth conductive pad in a plan view, a portion of the first pad insulating layer is between a bonding interface between the first semiconductor chip and the second semiconductor chip, and the outer portion of the first conductive pad, a portion of the second pad insulating layer is between the bonding interface and the outer portion of the third conductive pad, and each of the first conductive pad, the second conductive pad, the third conductive pad, and the fourth conductive pad has a rectangular shape in a cross-sectional view.

BRIEF DESCRIPTION OF THE DRAWINGS

Features will be apparent to those of skill in the art by describing in detail exemplary embodiments with reference to the attached drawings in which:

FIG. 5 is a cross-sectional view illustrating a semiconductor package according to embodiments;

DETAILED DESCRIPTION

Figure 1:
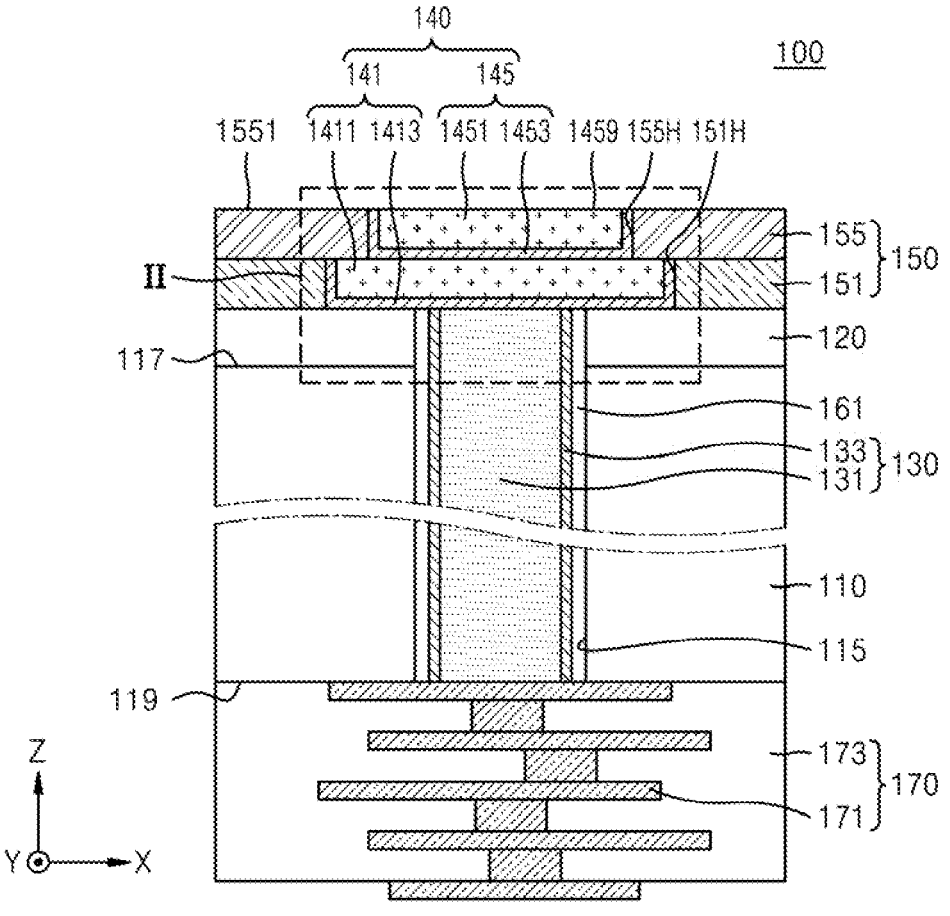
FIG. 1 is a cross-sectional view schematically illustrating a semiconductor chip according to embodiments.
Figure 2:
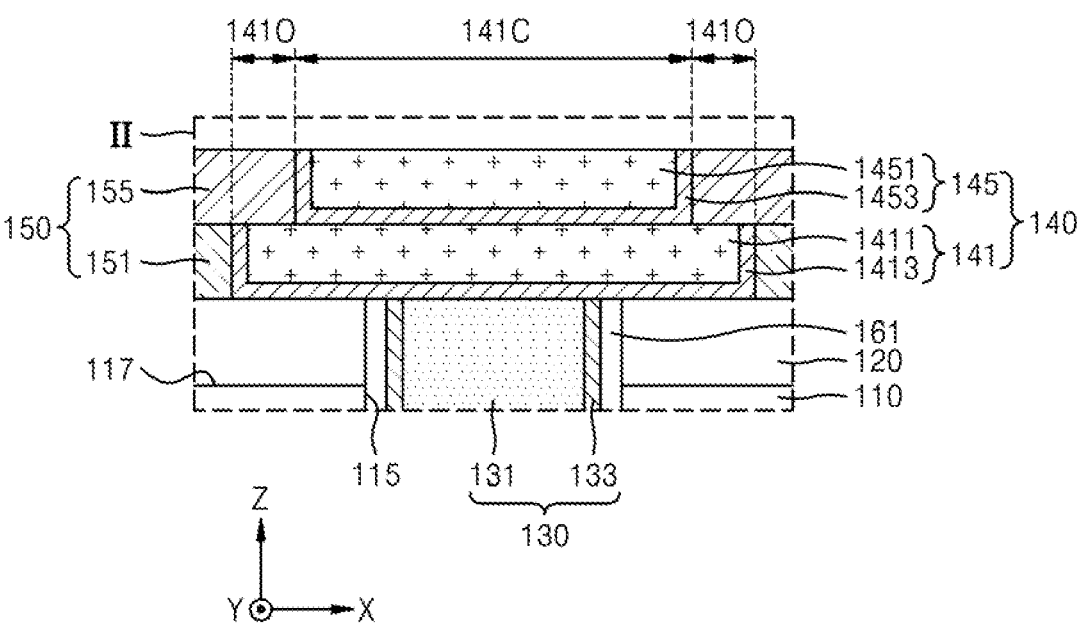
FIG. 2 is an enlarged view illustrating a region "II" in FIG. 1.
Figure 3:
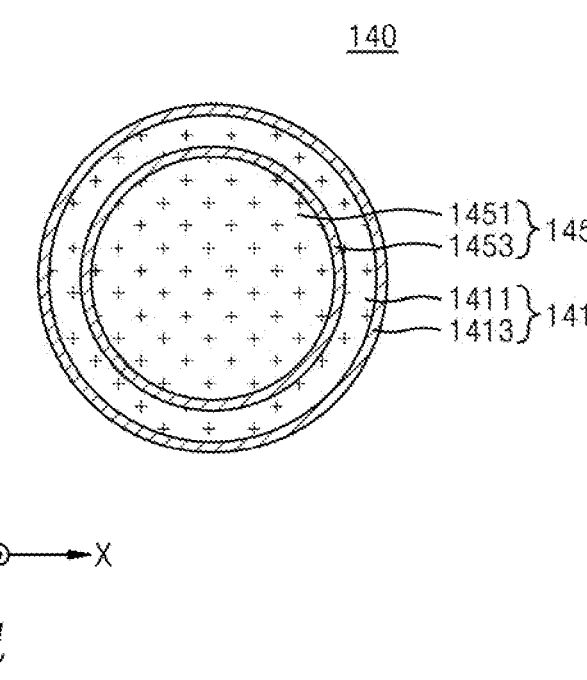
FIG. 3 is a plan view illustrating a bonding pad according to embodiments.

FIG. 1 is a cross-sectional view schematically illustrating a semiconductor chip 100 according to embodiments. FIG. 2 is an enlarged view illustrating a region "II" in FIG. 1. FIG. 3 is a plan view illustrating a bonding pad 140 according to embodiments.

Referring to FIGS. 1 to 3, the semiconductor chip 100 may include a semiconductor substrate 110, a passivation layer 120, a through electrode 130, the bonding pad 140, a pad insulating layer 150, and an interconnect structure 170.

The semiconductor substrate 110 may include a first surface 117 and a second surface 119, which are opposite to each other. The first surface 117 of the semiconductor substrate 110 may be a backside surface of the semiconductor substrate 110, and the second surface 119 of the semiconductor substrate 110 may be a front-side surface of the semiconductor substrate 110. The first surface 117 of the semiconductor substrate 110 may be an inactive surface of the semiconductor substrate 110, and the second surface 119 of the semiconductor substrate 110 may be an active surface of the semiconductor substrate 110.

Hereinafter, a direction parallel to the first surface 117 of the semiconductor substrate 110 is defined as a horizontal direction (e.g., an X direction and a Y direction), and a direction perpendicular to the first surface 117 of the semiconductor substrate 110 is defined as a vertical direction (e.g., a Z direction). In addition, a horizontal width refers to a length along the horizontal direction (e.g., the X direction and/or the Y direction), and a vertical height refers to a length along the vertical direction (e.g., the Z direction).

The semiconductor substrate 110 may be formed from a semiconductor wafer. The semiconductor substrate 110 may include, e.g., silicon (Si). In an implementation, the semiconductor substrate 110 may include a semiconductor element, such as germanium (Ge), or a compound semiconductor, such as silicon carbide (SiC), gallium arsenide (GaAs), indium arsenide (InAs), or indium phosphide (InP). The semiconductor substrate 110 may include a conductive region, e.g., a well doped with impurities or a structure doped with impurities. In an implementation, the semiconductor substrate 110 may have various device isolation structures, such as a shallow trench isolation (STI) structure. As used herein, the term "or" is not an exclusive term, e.g., "A or B" would include A, B, or A and B.

The passivation layer 120 may be on the first surface 117 of the semiconductor substrate 110. The passivation layer 120 may cover the first surface 117 of the semiconductor substrate 110. In an implementation, the passivation layer 120 may surround the sidewall of a portion of the through electrode 130 protruding from the first surface 117 of the semiconductor substrate 110.

In an implementation, the passivation layer 120 may include oxide or nitride. In an implementation, the passivation layer 120 may include SiO, SiN, SiCN, SiCO, or a polymer material. In an implementation, the polymer material may be benzocyclobutene (BCB), polyimide (PI), polybenzoxazole (PBO), silicone, or epoxy. In an implementation, the passivation layer 120 may have a multilayer structure including a plurality of insulating material layers stacked in the vertical direction (e.g., the Z direction).

The through electrode 130 may penetrate the semiconductor substrate 110 and the passivation layer 120. The through electrode 130 may be in a through hole 115 of the semiconductor substrate 110 extending from the second surface 119 to the first surface 117 of the semiconductor substrate 110. In an implementation, the through electrode 130 may protrude from the first surface 117 of the semiconductor substrate 110, and extend from the lower surface of the passivation layer 120 to the upper surface of the passivation layer 120 to penetrate the passivation layer 120. In an implementation, the horizontal width (or the diameter) of the upper surface of the through electrode 130 may be about 5 micrometers ($\mu$m) to about 30 $\mu$m, about 5 $\mu$m to about 20 $\mu$m, or about 5 $\mu$m to about 10 $\mu$m.

The through electrode 130 may include a conductive plug 131 and a conductive barrier layer 133 on the outer surface of the conductive plug 131. The conductive plug 131 may have a shape of a column extending to penetrate the semiconductor substrate 110 and the passivation layer 120. The conductive barrier layer 133 may surround the sidewall of the conductive plug 131. The conductive barrier layer 133 may have a cylindrical shape surrounding the sidewall of the conductive plug 131. The conductive barrier layer 133 may extend from the lower end to the upper end of the sidewall of the conductive plug 131, and cover the entire sidewall of the conductive plug 131. In an implementation, the conductive plug 131 may include copper (Cu), nickel (Ni), gold (Au), silver (Ag), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), ruthenium (Ru), or a combination thereof. The conductive barrier layer 133 may include titanium (Ti), titanium nitride (TiN), tantalum (Ta), tantalum nitride (TaN), tungsten (W), tungsten nitride (WN), ruthenium (Ru), cobalt (Co), or a combination thereof. The conductive plug 131 and the conductive barrier layer 133 may be formed by, e.g., physical vapor deposition (PVD), chemical vapor deposition (CVD), or plating.

A via insulating layer 161 may be between the semiconductor substrate 110 and the through electrode 130. The via insulating layer 161 may extend from the second surface 119 to the first surface 117 of the semiconductor substrate 110, and surround the sidewall of the through electrode 130 in the through hole 115 of the semiconductor substrate 110. In an implementation, the via insulating layer 161 may be between the through electrode 130 and the passivation layer 120, and surround a portion of the through electrode 130 protruding from the first surface 117 of the semiconductor substrate 110. The via insulating layer 161 may include an oxide. In an implementation, the via insulating layer 161 may include ozone/tetra-ethyl ortho-silicate (O$_3$/TEOS)-based high-aspect-ratio process (HARP) oxide formed by low-pressure chemical vapor deposition (CVD) (sub-atmospheric CVD).

The bonding pad 140 may be on the first surface 117 of the semiconductor substrate 110. The bonding pad 140 may be on the through electrode 130 and the passivation layer 120, and may be physically and electrically connected to the upper surface of the through electrode 130.

In an implementation, the sidewall of the bonding pad 140 may have a step-like structure. In an implementation, a lower portion of the bonding pad 140 may protrude laterally or outwardly with respect to an upper portion of the bonding pad 140 such that the sidewall of the bonding pad 140 has a step-like structure.

In an implementation, the bonding pad 140 may include a first conductive pad 141 and a second conductive pad 145, which are stacked in the vertical direction (e.g., the Z direction). The first conductive pad 141 may be on the upper surface of the through electrode 130 and on the upper surface of the passivation layer 120. The first conductive pad 141 may be in contact with the conductive plug 131 of the through electrode 130 and the conductive barrier layer 133. The second conductive pad 145 may be on the first conductive pad 141. As used herein, the terms "first," "second," and the like are merely for identification and differentiation, and are not intended to imply or require sequential inclusion (e.g., a third element and a fourth element may be described without implying or requiring the presence of a first element or second element).

A horizontal width (e.g., diameter) of the first conductive pad 141 may be greater than a horizontal width (e.g., diameter) of the second conductive pad 145, and a portion of the first conductive pad 141 may protrude laterally from or outwardly relative to the sidewall of the second conductive pad 145. In an implementation, a central portion 141C of the first conductive pad 141 may overlap or underlie the second conductive pad 145, and an outer portion 1410 of the first conductive pad 141 may protrude laterally from or relative to the sidewall of the second conductive pad 145. In an implementation, the outer portion 1410 of the first conductive pad 141 may protrude laterally from the sidewall of the second conductive pad 145, and may have a ring shape continuously extending along or around the sidewall of the second conductive pad 145 in a plan view (e.g., the first conductive pad 141 may be concentric with the second conductive pad 145 and the first conductive pad 141 may have a diameter greater than that of the second conductive pad 145).

In an implementation, in a cross-sectional view, each of the first conductive pad 141 and the second conductive pad 145 may have a quadrangular shape, e.g., a rectangular shape. Each of the upper surface and bottom surface of the first conductive pad 141 may be planar, and each of an upper surface 1459 and a bottom surface of the second conductive pad 145 may be planar. In an implementation, in a cross-sectional view, each of the first conductive pad 141 and the second conductive pad 145 may have a tapered shape in which a horizontal width decreases toward the first surface 117 of the semiconductor substrate 110.

In an implementation, in a plan view, each of the first conductive pad 141 and the second conductive pad 145 may have a circular shape. In an implementation, in a plan view, each of the first conductive pad 141 and the second conductive pad 145 may have a polygonal shape, e.g., a quadrangular shape.

In an implementation, the semiconductor chip 100 may include a plurality of bonding pads 140 spaced apart from each other in the horizontal direction (e.g., the X-direction and/or the Y-direction). In an implementation, a center-to-center distance (e.g., pitch) of two adjacent bonding pads 140 may be about 10 μm to about 50 μm, or about 10 μm to about 30 μm.

In an implementation, the horizontal width of the first conductive pad 141 may be about 10 μm to about 50 μm, about 10 μm to about 30 μm, or about 10 μm to about 20 μm. In an implementation, the horizontal width of the second conductive pad 145 may be about 5 μm to about 30 μm, about 5 μm to about 20 μm, or about 5 μm to about 15 μm. In an implementation, the vertical height of the first conductive pad 141 may be about 1 μm to about 10 μm. In an implementation, the vertical height of the second conductive pad 145 may be about 1 μm to about 10 μm.

In an implementation, a length by which the outer portion 1410 of the first conductive pad 141 protrudes laterally from the sidewall of the second conductive pad 145 may be about 1 μm to about 10 μm or about 1 μm to about 5 μm.

On the first surface 117 of the semiconductor substrate 110, the pad insulating layer 150 may surround the bonding pad 140. The pad insulating layer 150 may include an oxide or a nitride. In an implementation, the pad insulating layer 150 may include SiO, SiN, SiCN, SiCO, or a polymer material. In an implementation, the polymer material may include BCB, PI, PBO, silicone, or an epoxy. In an implementation, the pad insulating layer 150 may have a multi-layer structure including a plurality of insulating material layers stacked in the vertical direction (e.g., the Z direction).

In an implementation, the pad insulating layer 150 may include a first insulating layer 151 and a second insulating layer 155, which are sequentially stacked on the passivation layer 120. The first insulating layer 151 may cover the upper surface of the passivation layer 120 and surround the sidewall of the first conductive pad 141. The first insulating layer 151 may extend from the lower end to the upper end of the sidewall of the first conductive pad 141, and the upper surface of the first insulating layer 151 may be at the same or similar vertical level as the upper surface of the first conductive pad 141. The second insulating layer 155 may cover the upper surface of the first insulating layer 151 and surround the sidewall of the second conductive pad 145. The second insulating layer 155 may cover the upper surface of the outer portion 1410 of the first conductive pad 141. The second insulating layer 155 may extend from the lower end to the upper end of the sidewall of the second conductive pad 145, and an upper surface 1551 of the second insulating layer 155 may be at the same or similar vertical level as the upper surface 1459 of the second conductive pad 145. The upper surface 1551 of the second insulating layer 155 and the upper surface 1459 of the second conductive pad 145 may be exposed to the outside of the semiconductor chip 100, and may constitute a bonding surface of the semiconductor chip 100. The upper surface 1551 of the second insulating layer 155 may have a bonding force suitable for bonding, through plasma treatment or wet treatment.

In an implementation, the material of the first insulating layer 151 and the material of the second insulating layer 155 may be the same as each other. In an implementation, the first insulating layer 151 and the second insulating layer 155 may include silicon oxide.

In an implementation, the material of the first insulating layer 151 and the material of the second insulating layer 155 may be different from each other. In an implementation, the first insulating layer 151 may include silicon nitride, and the second insulating layer 155 may include silicon oxide.

In an implementation, the first conductive pad 141 may include a first core metal layer 1411 and a first seed metal layer 1413. The first core metal layer 1411 may have a shape similar to that of the first conductive pad 141. In an implementation, the first core metal layer 1411 may have a rectangular shape in a cross-sectional view. The first seed metal layer 1413 may partially cover the surface of the first core metal layer 1411. The first seed metal layer 1413 may continuously extend along the sidewall and bottom surface of the first core metal layer 1411, e.g., conformally, and may have a substantially uniform thickness. In an implementation, the first seed metal layer 1413 may be between the sidewall of the first core metal layer 1411 and the first insulating layer 151, between the bottom surface of the first core metal layer 1411 and the passivation layer 120, and between the bottom surface of the first core metal layer 1411 and the through electrode 130. The first core metal layer 1411 may be spaced apart from the first insulating layer 151, the passivation layer 120, and the through electrode 130, with the first seed metal layer 1413 therebetween. In an implementation, the first core metal layer 1411 may be formed by performing a plating process using the first seed metal layer 1413.

In an implementation, the second conductive pad 145 may include a second core metal layer 1451 and a second seed metal layer 1453. The second core metal layer 1451 may have a shape similar to that of the second conductive pad 145. In an implementation, the second core metal layer 1451 may have a rectangular shape in a cross-sectional view. The second seed metal layer 1453 may partially cover the surface of the second core metal layer 1451. The second seed metal layer 1453 may continuously extend along the sidewall and bottom surface of the second core metal layer 1451, e.g., conformally, and may have a substantially uniform thickness. In an implementation, the second seed metal layer 1453 may be between the sidewall of the second core metal layer 1451 and the second insulating layer 155, and between the bottom surface of the second core metal layer 1451 and the first conductive pad 141. The second core metal layer 1451 may be spaced apart from the second insulating layer 155 and the first conductive pad 141, with the second seed metal layer 1453 therebetween. In an implementation, the second core metal layer 1451 may be formed by performing a plating process using the second seed metal layer 1453.

In an implementation, the first core metal layer 1411 and the second core metal layer 1451 may each independently include, e.g., copper (Cu), nickel (Ni), gold (Au), silver (Ag), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), or ruthenium (Ru).

In an implementation, the first seed metal layer 1413 and the second seed metal layer 1453 may each independently include, e.g., chromium (Cr), tungsten (W), titanium (Ti), copper (Cu), nickel (Ni), aluminum (Al), palladium (Pd), gold (Au), or a combination thereof. In an implementation, the first seed metal layer 1413 and the second seed metal layer 1453 may have a structure in which a Ti layer, a TiW layer, and a Cu layer are stacked.

The interconnect structure 170 may be on the second surface 119 of the semiconductor substrate 110. The interconnect structure 170 may include a back-end-of-line (BEOL) structure on the second surface 119 of the semiconductor substrate 110. The interconnect structure 170 may include an interconnect insulating layer 173 on the second surface 119 of the semiconductor substrate 110, and a conductive interconnect pattern 171 in the interconnect insulating layer 173. The conductive interconnect pattern 171 of the interconnect structure 170 may be electrically connected to the through electrode 130. In an implementation, the interconnect structure 170 may be electrically connected to an integrated circuit of the semiconductor chip 100.

The conductive interconnect pattern 171 of the interconnect structure 170 may include a plurality of interconnect lines and a plurality of interconnect vias. The plurality of interconnect lines and the plurality of interconnect vias may be covered by the interconnect insulating layer 173. Each of the plurality of interconnect lines may extend in the horizontal direction (e.g., the X direction and/or the Y direction) within the interconnect insulating layer 173. The plurality of interconnect lines may be positioned at different levels in the vertical direction (e.g., the Z direction) within the interconnect insulating layer 173 to constitute a multilayer interconnect structure. The plurality of interconnect vias may extend between the plurality of interconnect lines positioned at different vertical levels to electrically connect the plurality of interconnect lines positioned at the different vertical levels to each other.

In an implementation, the plurality of interconnect lines and the plurality of interconnect vias may include copper (Cu), aluminum (Al), tungsten (W), titanium (Ti), tantalum (Ta), indium (In), and molybdenum (Mo), manganese (Mn), cobalt (Co), tin (Sn), nickel (Ni), magnesium (Mg), rhenium (Re), beryllium (Be), gallium (Ga), ruthenium (Ru), or an alloy thereof.

In an implementation, the interconnect insulating layer 173 may include an oxide or a nitride. In an implementation, the interconnect insulating layer 173 may include silicon oxide or silicon nitride. In an implementation, the interconnect insulating layer 173 may include an insulating material formed of a photo imageable dielectric (PID) material, photosensitive polyimide (PSPI), or the like.

FIGS. 4A to 4I are cross-sectional views of stages in a method of fabricating a semiconductor chip, according to embodiments. Hereinafter, the method of fabricating semiconductor chip 100 illustrated in FIGS. 1 to 3 is described with reference to FIGS. 4A to 4I.

Figure 4A:
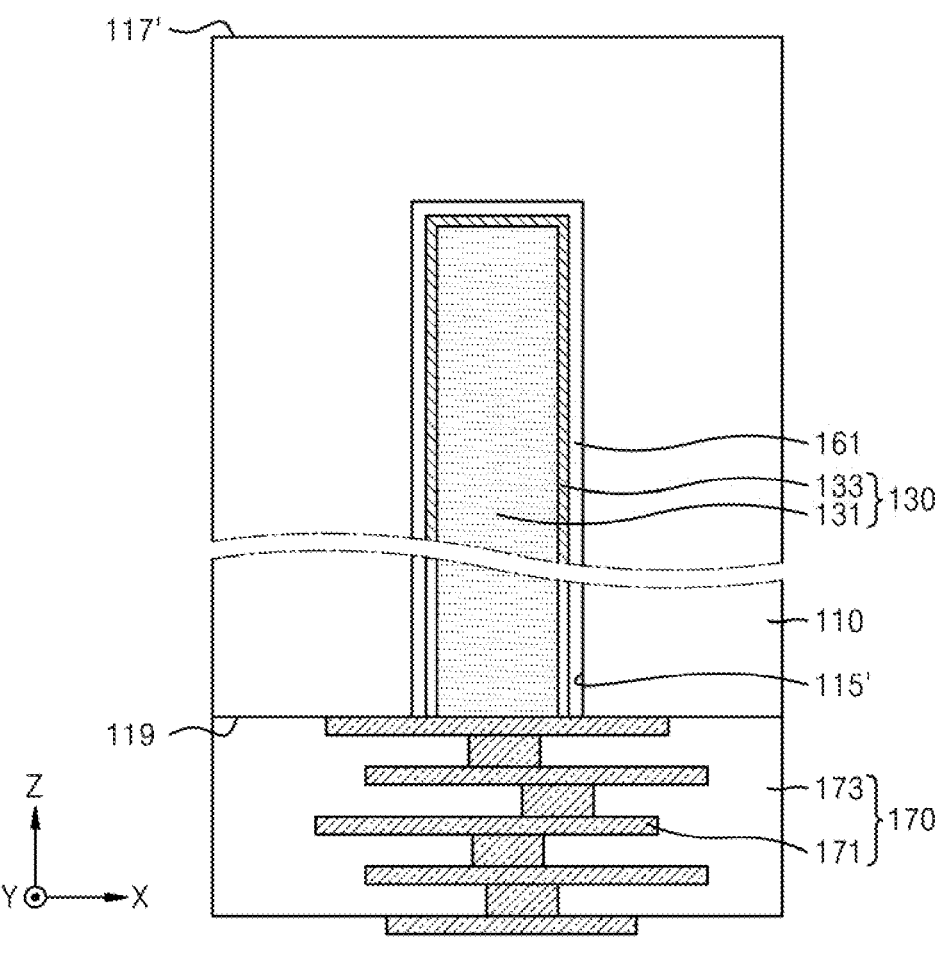
FIGS. 4A to 4I are cross-sectional views of stages in a method of fabricating a semiconductor chip, according to embodiments.

Referring to FIG. 4A, the semiconductor substrate 110 including a first surface 117' and the second surface 119, which are opposite to each other, may be prepared. The semiconductor substrate 110 may be, e.g., a semiconductor wafer. Thereafter, a hole 115' partially penetrating the semiconductor substrate 110 may be formed. The hole 115' may extend from the second surface 119 of the semiconductor substrate 110 toward the first surface 117' thereof. After forming the hole 115' in the semiconductor substrate 110, the via insulating layer 161, the conductive barrier layer 133, and the conductive plug 131 may be sequentially formed on the inner sidewall of the semiconductor substrate 110, which defines the hole 115' of the semiconductor substrate 110. The conductive barrier layer 133 and the conductive plug 131 may form the through electrode 130. After forming the via insulating layer 161 and the through electrode 130, the interconnect structure 170 is formed on the second surface 119 of the semiconductor substrate 110. The interconnect structure 170 may be formed by using, e.g., a damascene process.

Figure 4B:
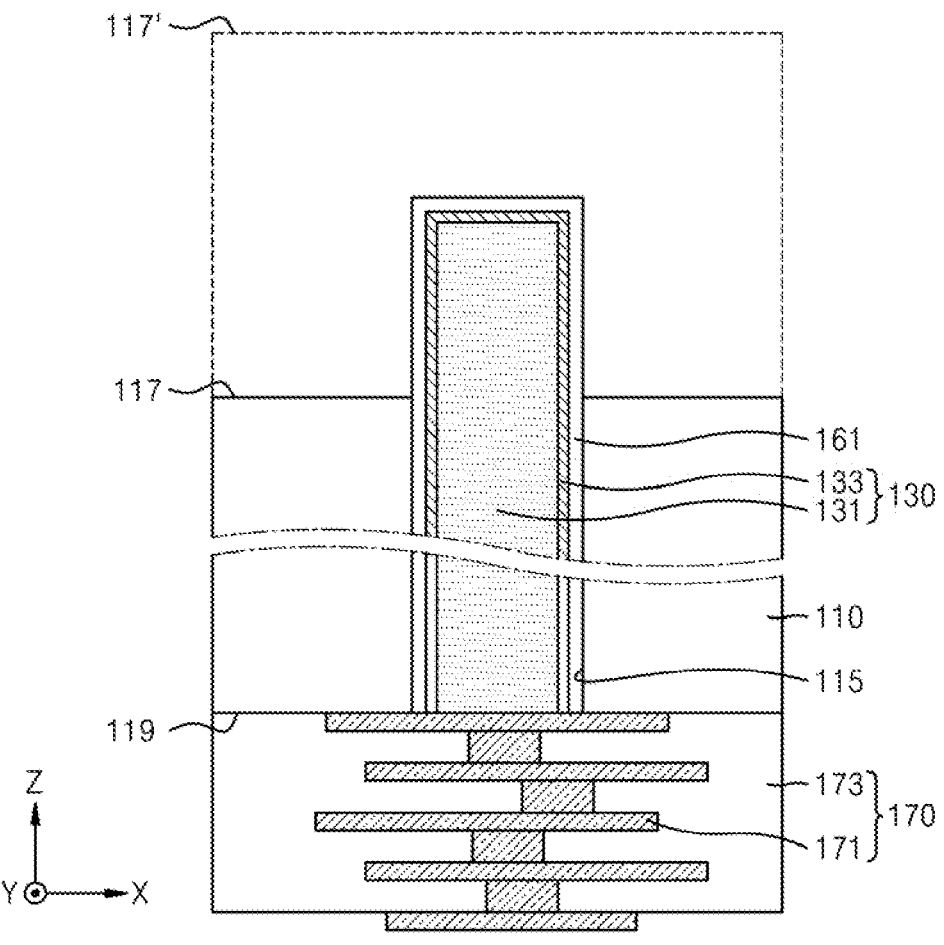

Referring to FIG. 4B, a portion of the semiconductor substrate 110 may be removed to expose a portion of the through electrode 130. As a result of removing the portion of the semiconductor substrate 110, the through electrode 130 may penetrate the semiconductor substrate 110 and protrude from the first surface 117 of the semiconductor substrate 110. In order to expose the through electrode 130, the portion of the semiconductor substrate 110 may be removed by using a chemical mechanical polishing (CMP) process, an etch-back process, or a combination thereof.

Figure 4C:
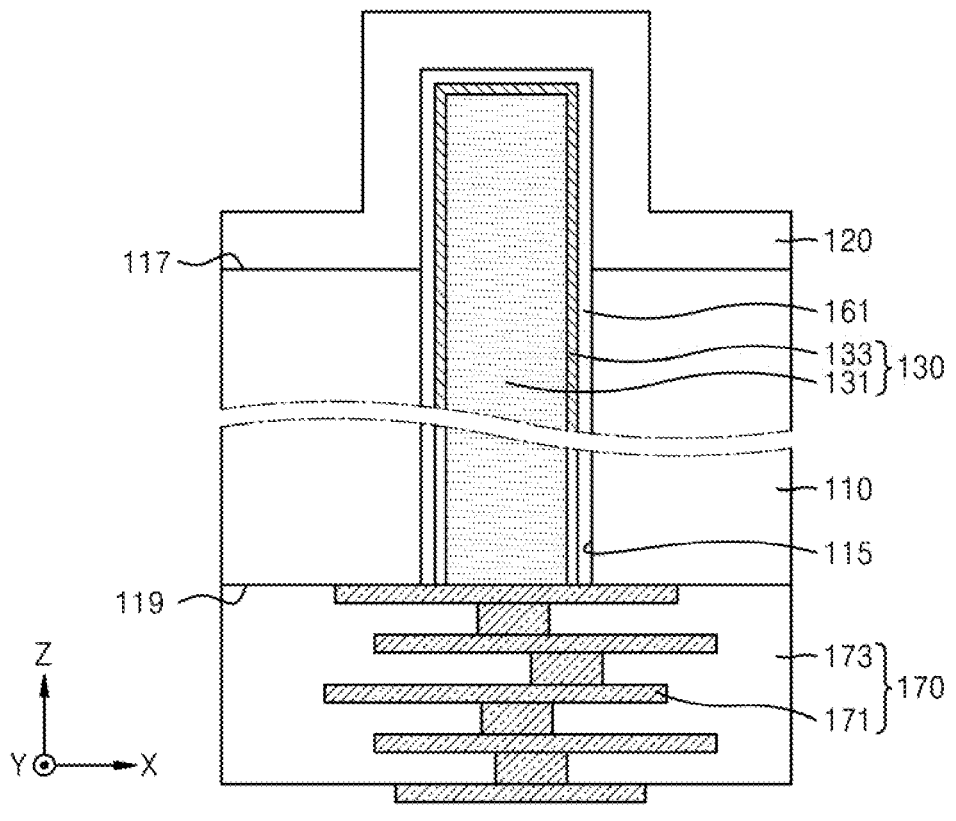

Referring to FIG. 4C, the passivation layer 120 is formed on the first surface 117 of the semiconductor substrate 110 and the portion of the through electrode 130, which protrudes from the semiconductor substrate 110.

Figure 4D:
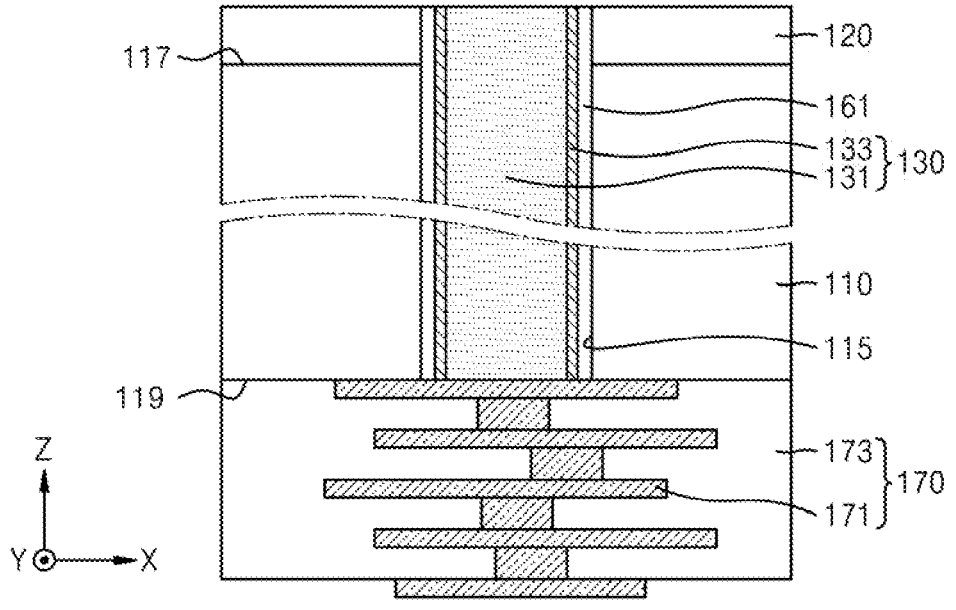

Referring to FIGS. 4C and 4D, after forming the passivation layer 120, a polishing process may be performed on the resultant product of FIG. 4C to expose the through electrode 130. In an implementation, a portion of the passivation layer 120, a portion of the via insulating layer 161, a portion of the conductive barrier layer 133, and a portion of the conductive plug 131 may be removed in the polishing process. In embodiments, the polishing process may include a CMP process. In an implementation, the upper surface of the passivation layer 120 and the upper surface of the through electrode 130 may be planarized in the polishing process. In an implementation, the upper surface of the passivation layer 120 and the upper surface of the through electrode 130 may be substantially coplanar with each other.

Figure 4E:
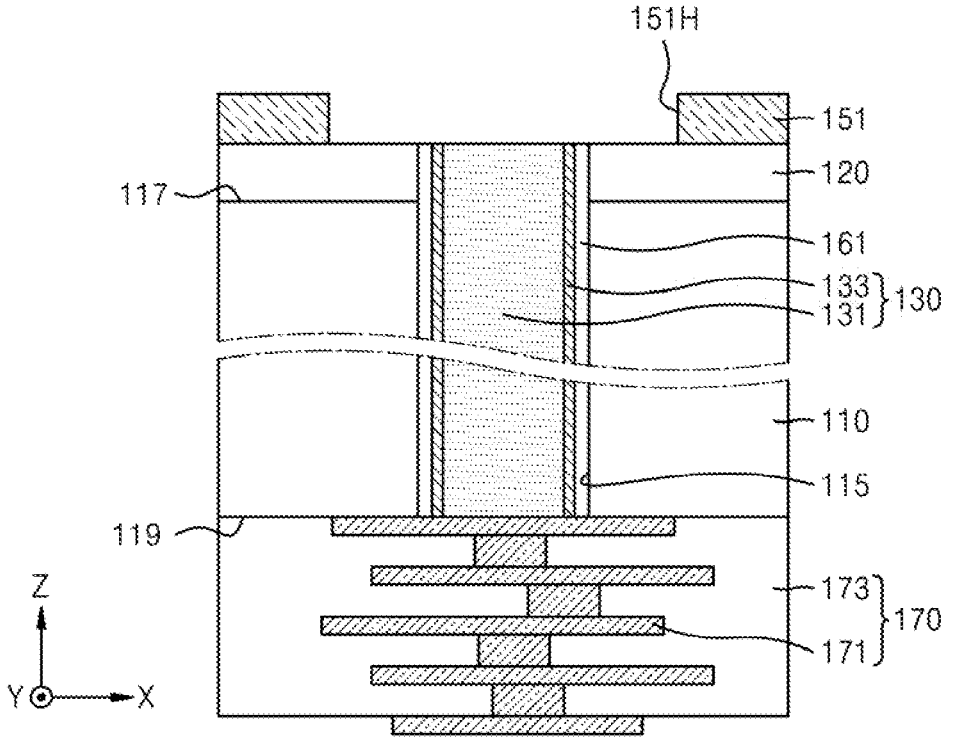

Referring to FIG. 4E, the first insulating layer 151 including a first opening 151H for exposing the through electrode 130 may be formed on the passivation layer 120. In order to form the first insulating layer 151, an insulating material layer covering the passivation layer 120 and the through electrode 130 may be formed, and then a portion of the insulating material layer may be removed to form the first opening 151H exposing the through electrode 130. In an implementation, removing the portion of the insulating material layer may include an etching process and a laser drilling process.

Figure 4F:
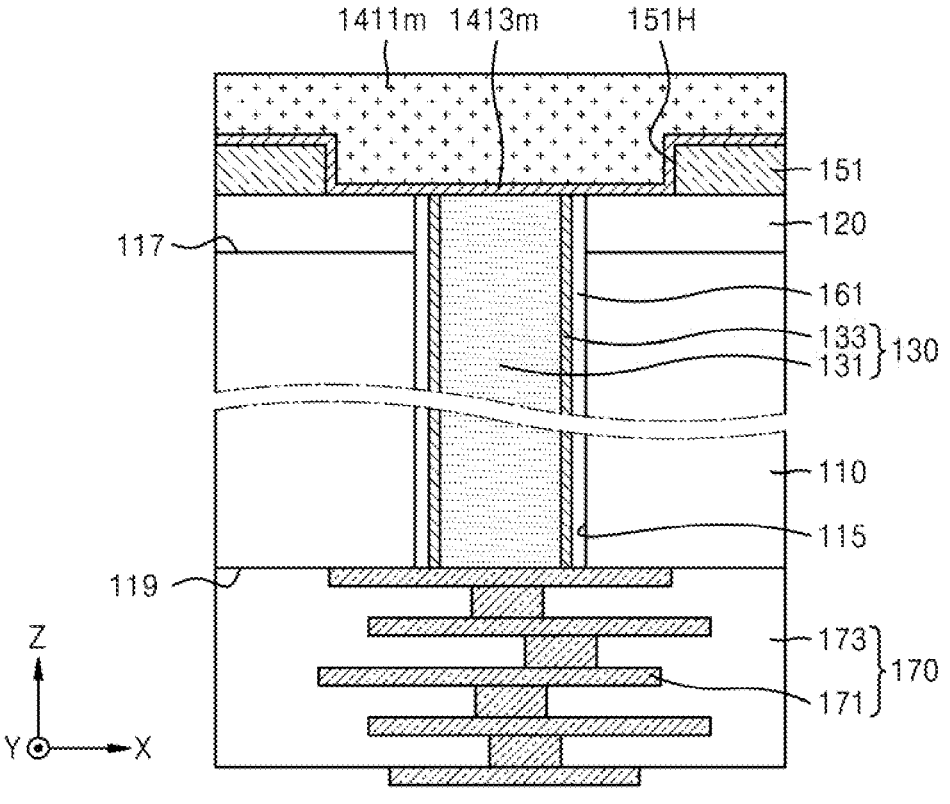

Referring to FIG. 4F, after forming the first insulating layer 151, a first preliminary seed metal layer 1413m and a first preliminary core metal layer 1411m may be sequentially formed. The first preliminary seed metal layer 1413m may conformally extend along the surface of the first insulating layer 151, the surface of the passivation layer 120 exposed by the first opening 151H of the first insulating layer 151, and the surface of the through electrode 130 exposed by the first opening 151H of the first insulating layer 151. In an implementation, the first preliminary seed metal layer 1413m may be formed by performing a PVD process, such as sputtering. The first preliminary core metal layer 1411m may be formed to cover the first preliminary seed metal layer 1413m. The first preliminary core metal layer 1411m may be formed by performing an electroplating process using the first preliminary seed metal layer 1413m.

Figure 4G:
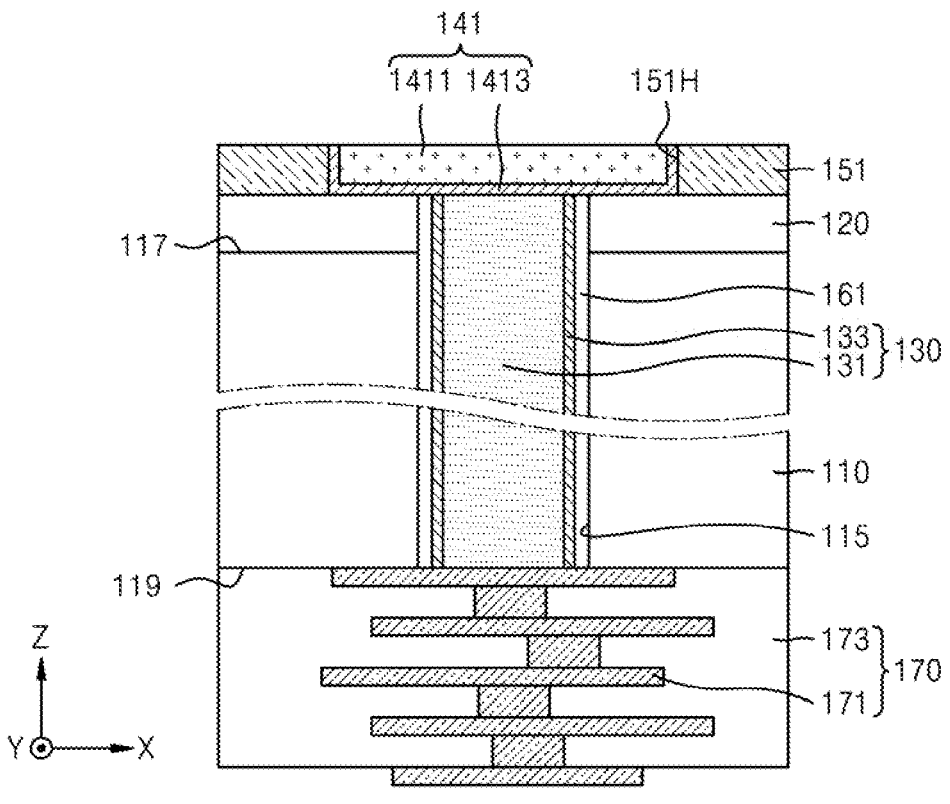

Referring to FIGS. 4F and 4G, after forming the first preliminary seed metal layer 1413m and the first preliminary core metal layer 1411m, a portion of the first preliminary seed metal layer 1413m and a portion of the first preliminary core metal layer 1411m may be removed to expose the first insulating layer 151. In an implementation, the portion of the first preliminary seed metal layer 1413m and the portion of the first preliminary core metal layer 1411m may be removed by performing a planarization process on the resultant product of FIG. 4F, to expose the first insulating layer 151. The planarization process may include a CHIP process.

The portion of the first preliminary seed metal layer 1413m and the portion of the first preliminary core metal layer 1411m, which are outside the first opening 151H of the first insulating layer 151, may be removed in the planarization process. A portion of the first preliminary seed metal layer 1413m remaining after the planarization process may form the first seed metal layer 1413, and a portion of the first preliminary core metal layer 1411m remaining after the planarization process may form the first core metal layer 1411. The first seed metal layer 1413 and the first core metal layer 1411 may constitute the first conductive pad 141. The first conductive pad 141 may be formed to fill the first opening 151H of the first insulating layer 151, and may be in contact with the upper surface of the through electrode 130. A portion of the first insulating layer 151 may be removed in the planarization process, and the upper surface of the first insulating layer 151 and the upper surface of the first conductive pad 141 obtained as a result of the planarization process may be substantially coplanar with each other.

Figure 4H:
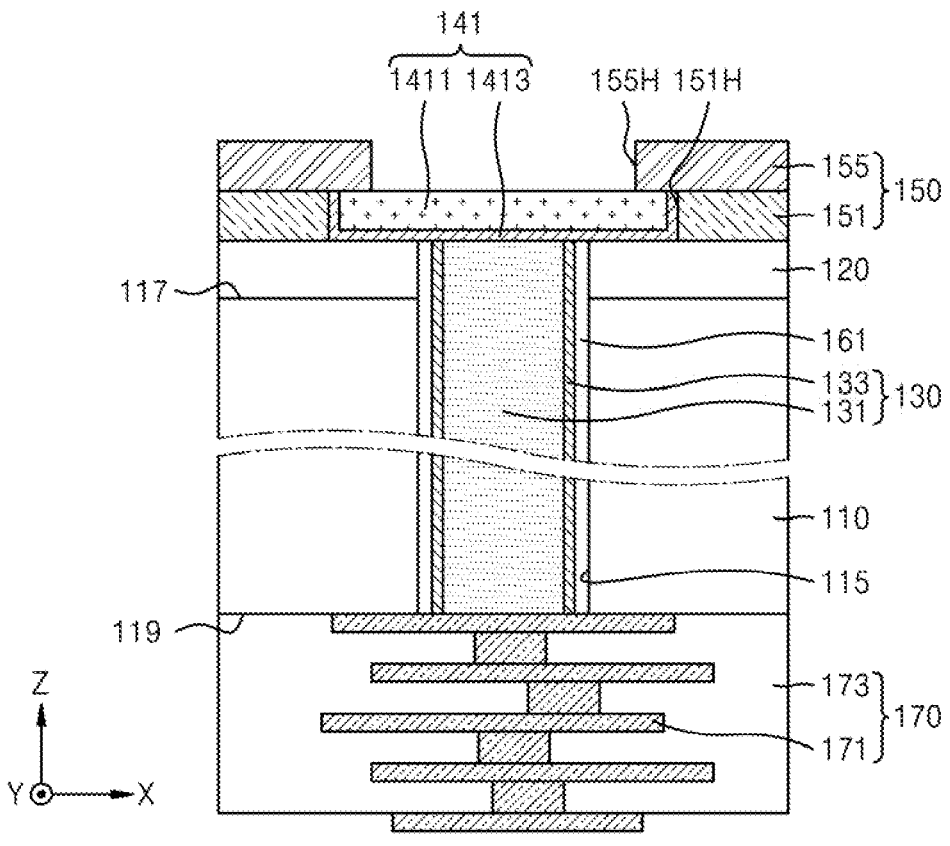

Referring to FIG. 4H, the second insulating layer 155 including a second opening 155H for exposing the first conductive pad 141 may be formed on the second insulating layer 155. In order to form the second insulating layer 155, an insulating material layer covering a portion of the first conductive pad 141 and the second insulating layer 155 may be formed, and then a portion of the insulating material layer may be removed to form the second opening 155H partially exposing the upper surface of the first conductive pad 141. In an implementation, removing the portion of the insulating material layer may include an etching process and a laser drilling process.

Figure 4I:
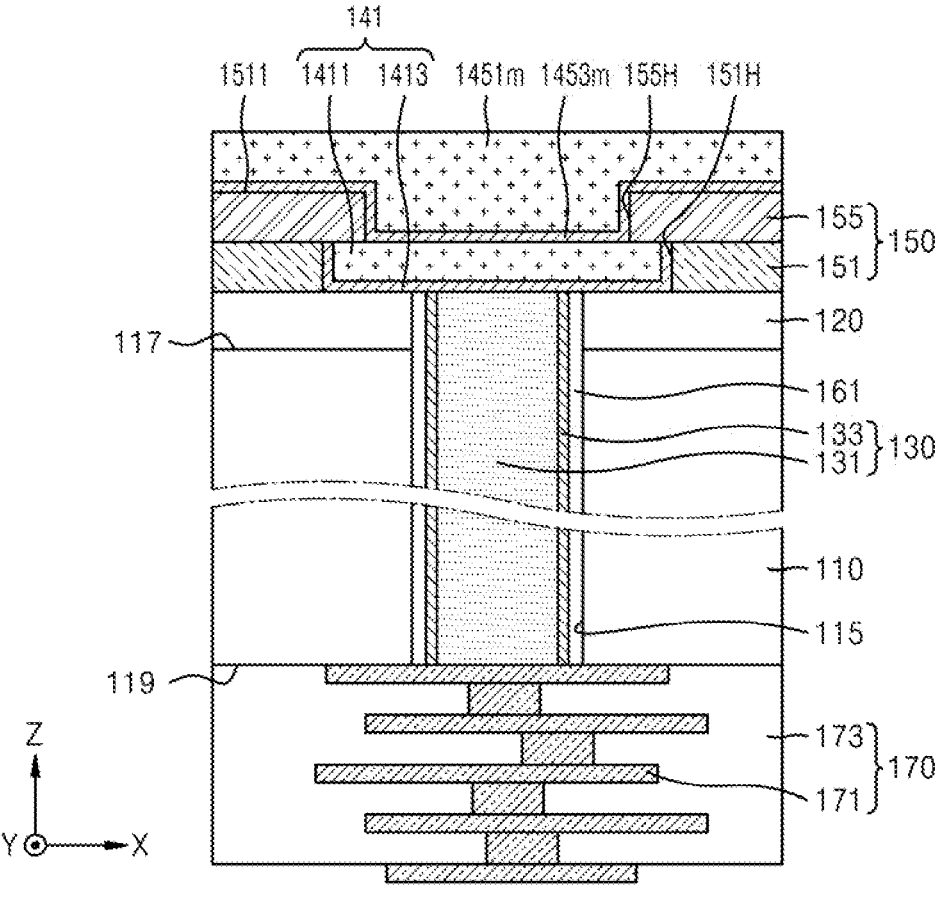

Referring to FIG. 4I, after forming the second insulating layer 155, a second preliminary seed metal layer 1453m and a second preliminary core metal layer 1451m are sequentially formed. The second preliminary seed metal layer 1453m may conformally extend along the surface of the second insulating layer 155 and the upper surface of the first conductive pad 141 exposed by the second opening 155H of the second insulating layer 155. In an implementation, the second preliminary seed metal layer 1453m may be formed by performing a PVD process, such as sputtering. The second preliminary core metal layer 1451m may be formed to cover the second preliminary seed metal layer 1453m. The second preliminary core metal layer 1451m may be formed by performing an electroplating process using the second preliminary seed metal layer 1453m.

Referring to FIGS. 4I and 1, after forming the second preliminary seed metal layer 1453m and the second preliminary core metal layer 1451m, a portion of the second preliminary seed metal layer 1453m and a portion of the second preliminary core metal layer 1451m may be removed to expose the second insulating layer 155. In an implementation, the portion of the second preliminary seed metal layer 1453m and the portion of the second preliminary core metal layer 1451m may be removed by performing a planarization process on the resultant product of FIG. 4I, to expose the second insulating layer 155. The planarization process may include a CMP process.

The portion of the second preliminary seed metal layer 1453m and the portion of the second preliminary core metal layer 1451m, which are outside the second opening 155H of the second insulating layer 155, may be removed in the planarization process. A portion of the second preliminary seed metal layer 1453m remaining after the planarization process may form the second seed metal layer 1453, and a portion of the second preliminary core metal layer 1451m remaining after the planarization process may form the second core metal layer 1451. The second seed metal layer 1453 and the second core metal layer 1451 may constitute the second conductive pad 145, and the first conductive pad 141 and the second conductive pad 145 may constitute the bonding pad 140. The second conductive pad 145 may be formed to fill the second opening 155H of the second insulating layer 155, and may be in contact with the upper surface of the first conductive pad 141. A portion of the second insulating layer 155 may be removed in the planarization process, and the upper surface 1551 of the second insulating layer 155 and the upper surface 1459 of the second conductive pad 145 obtained as a result of the planarization process may be substantially coplanar with each other.

Figure 5:
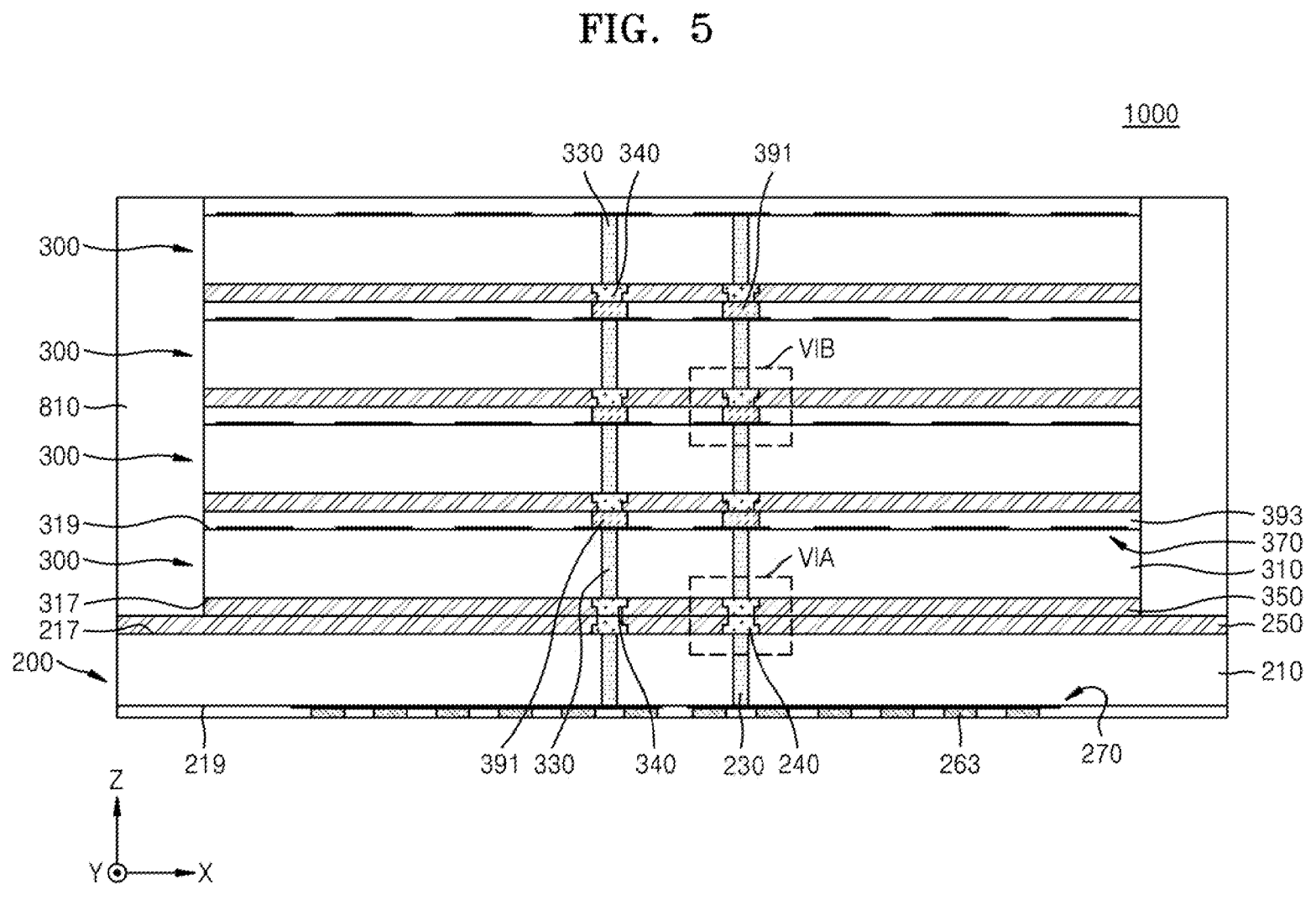
Figure 6A:
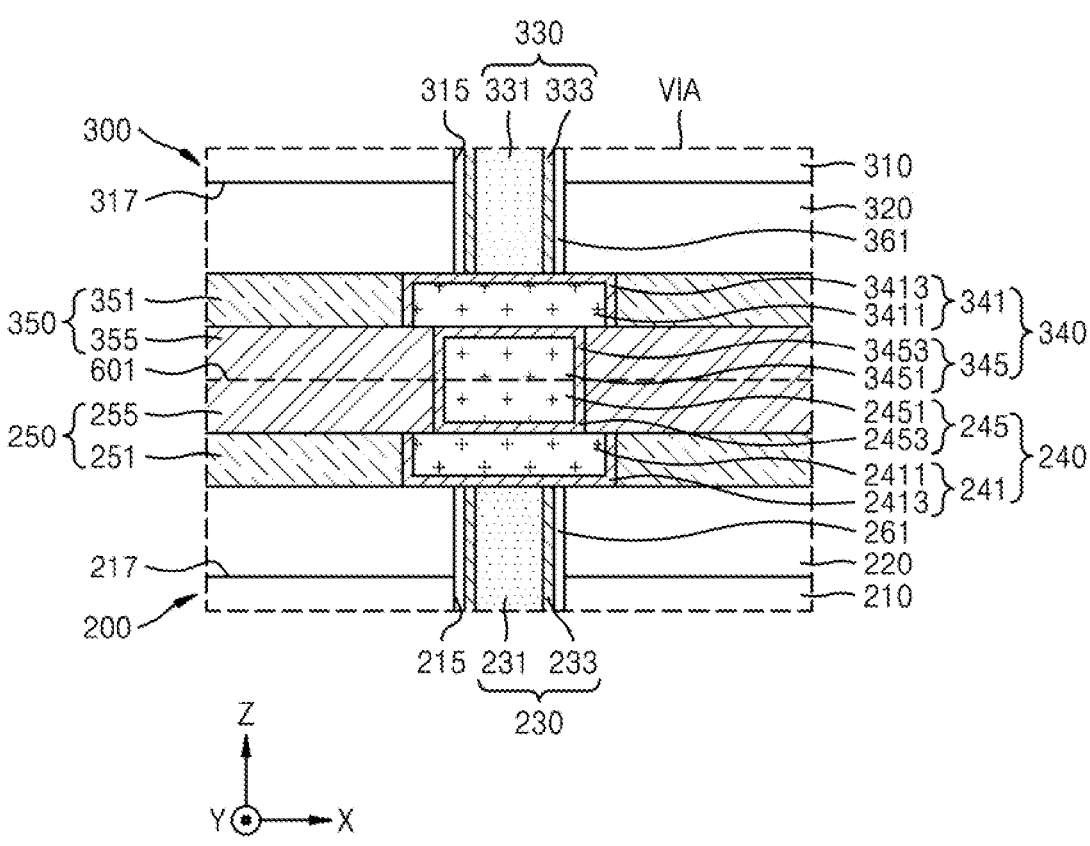
FIG. 6A is an enlarged view illustrating a region "VIA" in FIG. 5.
Figure 6B:
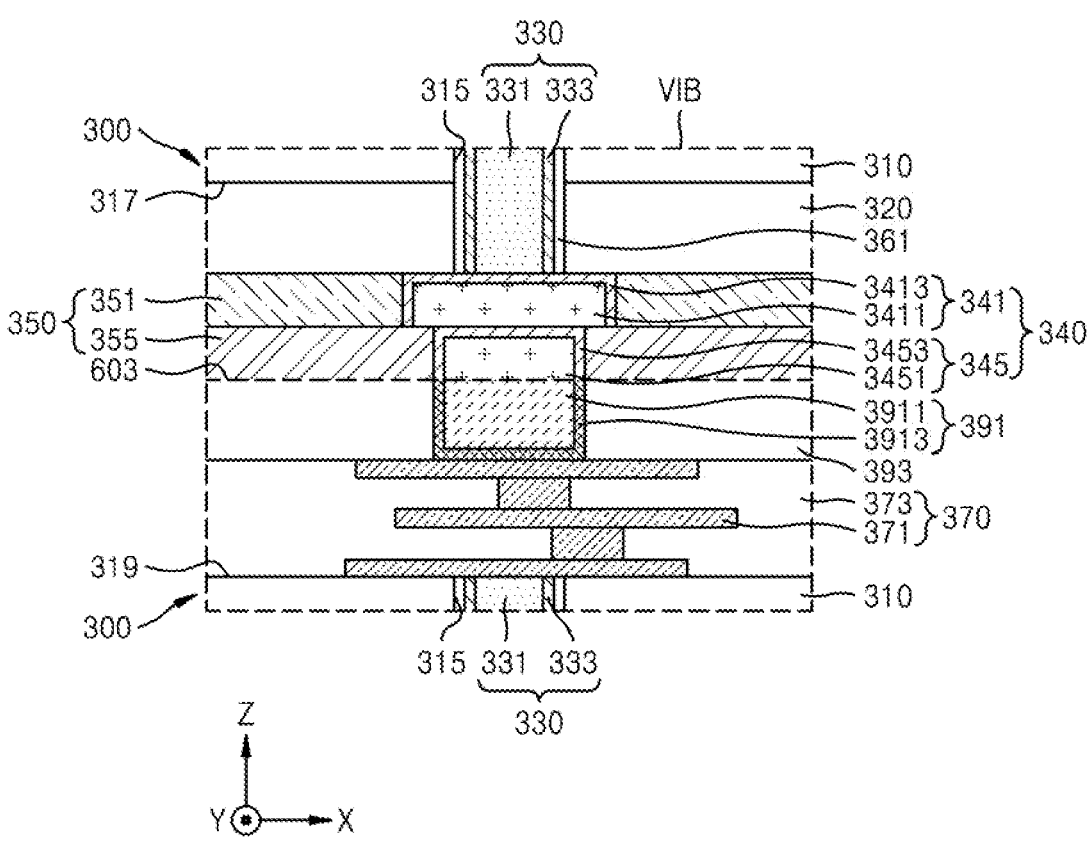
FIG. 6B is an enlarged view illustrating a region "VIB" in FIG. 5.

FIG. 5 is a cross-sectional view illustrating a semiconductor package 1000 (hereinafter, also referred to as the sub-semiconductor package 1000) according to embodiments. FIG. 6A is an enlarged view illustrating a region "VIA" in FIG. 5. FIG. 6B is an enlarged view illustrating a region "VIB" in FIG. 5.

Referring to FIGS. 5, 6A, and 6B, the semiconductor package 1000 may include a first semiconductor chip 200 and a plurality of second semiconductor chips 300 (hereinafter, also referred to as the upper, lower, uppermost, and lowermost second semiconductor chips 300). The plurality of second semiconductor chips 300 may be sequentially stacked on the first semiconductor chip 200 in the vertical direction (e.g., the Z direction). In an implementation, as illustrated in FIG. 5, the semiconductor package 1000 may include four second semiconductor chips 300. In an implementation, the semiconductor package 1000 may include two or more second semiconductor chips 300. In an implementation, the number of second semiconductor chips 300 included in the semiconductor package 1000 may be a multiple of 4. The semiconductor package 1000 may be referred to as a sub-semiconductor package.

The first semiconductor chip 200 may be electrically connected to the lowermost second semiconductor chip 300 among the plurality of second semiconductor chips 300, to exchange signals and provide power and ground. Two adjacent second semiconductor chips 300 among the plurality of second semiconductor chips 300 may be electrically connected to each other, to exchange signals and provide or receive power and ground.

The first semiconductor chip 200 may include a first semiconductor substrate 210 having an active surface 219 and an inactive surface 217, which are opposite to each other, a first interconnect structure 270 formed on the active surface 219 of the first semiconductor substrate 210 and including an interconnect insulating layer and an interconnect pattern, a plurality of first through electrodes 230 connected to the interconnect pattern of the first interconnect structure 270 and penetrating at least a portion of the first semiconductor chip 200, a first via insulating layer 261 surrounding the plurality of first through electrodes 230, a first passivation layer 220 formed on the inactive surface 217 of the first semiconductor substrate 210, a plurality of first bonding pads 240 connected to the plurality of first through electrodes 230 on the first passivation layer 220, and a first pad insulating layer 250 surrounding each of the plurality of first bonding pads 240. The first through electrode 230 may include a first conductive plug 231 and a first conductive barrier layer 233. The first bonding pad 240 may include a first conductive pad 241 connected to the first through electrode 230, and a second conductive pad 245 on the first conductive pad 241. A central portion of the first conductive pad 241 may vertically overlap or underlie the second conductive pad 245, and an outer portion of the first conductive pad 241 may protrude laterally from or relative to the sidewall of the second conductive pad 245. The outer portion of the first conductive pad 241 may have a ring shape continuously extending around the sidewall of the second conductive pad 245 in a plan view. The first conductive pad 241 may include a first core metal layer 2411 and a first seed metal layer 2413. The second conductive pad 245 may include a second core metal layer 2451 and a second seed metal layer 2453. The first pad insulating layer 250 may include a first insulating layer 251 surrounding the first conductive pad 241, and a second insulating layer 255 surrounding the second conductive pad 245.

The first semiconductor substrate 210 may be a component substantially the same as or similar to the semiconductor substrate 110 illustrated in FIG. 1, the first interconnect structure 270 may be a component substantially the same as or similar to the interconnect structure 170 illustrated in FIG. 1, the first through electrode 230 may be a component substantially the same as or similar to the through electrode 130 illustrated in FIG. 1, the first passivation layer 220 may be a component substantially the same as or similar to the passivation layer 120 illustrated in FIG. 1, the first bonding pad 240 may be a component substantially the same as or similar to the bonding pad 140 illustrated in FIG. 1, the first via insulating layer 261 may be a component substantially the same as or similar to the via insulating layer 161 illustrated in FIG. 1, and the first pad insulating layer 250 may be a component substantially the same as or similar to the pad insulating layer 150 illustrated in FIG. 1, and thus, repeated detailed descriptions thereof may be omitted. The first semiconductor chip 200 may further include a plurality of first connection pads 263 connected to the first interconnect structure 270. In the semiconductor package 1000, the first semiconductor chip 200 may be arranged such that the active surface 219 of the first semiconductor substrate 210 faces downward and the inactive surface 217 of the first semiconductor substrate 210 faces upward.

The second semiconductor chip 300 may include a second semiconductor substrate 310 having an inactive surface 317 and an active surface 319, which are opposite to each other, a second interconnect structure 370 formed on the active surface 319 of the second semiconductor substrate 310 and including a second interconnect insulating layer 373 and a second interconnect pattern 371, a plurality of second through electrodes 330 connected to the second interconnect structure 370 and penetrating at least a portion of the second semiconductor chip 300, a second via insulating layer 361 surrounding the plurality of second through electrodes 330, a second passivation layer 320 formed on the inactive surface 317 of the second semiconductor substrate 310, a plurality of second bonding pads 340 connected to the plurality of second through electrodes 330 on the lower surface of the second passivation layer 320, and a second pad insulating layer 350 surrounding each of the plurality of second bonding pads 340. The second through electrode 330 may include a second conductive plug 331 and a second conductive barrier layer 333. The second bonding pad 340 may include a third conductive pad 341 and a fourth conductive pad 345. The third conductive pad 341 may be connected to the lower surface of the second through electrode 330, and the fourth conductive pad 345 may be connected to the lower surface of the third conductive pad 341. A central portion of the third conductive pad 341 may vertically overlap the fourth conductive pad 345, and an outer portion of the third conductive pad 341 may protrude laterally from the sidewall of the fourth conductive pad 345. The outer portion of the third conductive pad 341 may have a ring shape continuously extending along the sidewall of the fourth conductive pad 345 in a plan view. The third conductive pad 341 may include a third core metal layer 3411 and a third seed metal layer 3413. The fourth conductive pad 345 may include a fourth core metal layer 3451 and a fourth seed metal layer 3453. The second pad insulating layer 350 may include a third insulating layer 351 and a fourth insulating layer 355. The third insulating layer 351 may extend along the lower surface of the second passivation layer 320 and surround the sidewall of the third conductive pad 341. The fourth insulating layer 355 may extend along the lower surface of the third insulating layer 351 and surround the sidewall of the fourth conductive pad 345.

The second semiconductor substrate 310 may be a component substantially the same as or similar to the semiconductor substrate 110 illustrated in FIG. 1, the second interconnect structure 370 may be a component substantially the same as or similar to the interconnect structure 170 illustrated in FIG. 1, the second through electrode 330 may be a component substantially the same as or similar to the through electrode 130 illustrated in FIG. 1, the second passivation layer 320 may be a component substantially the same as or similar to the passivation layer 120 illustrated in FIG. 1, the second bonding pad 340 may be a component substantially the same as or similar to the bonding pad 140 illustrated in FIG. 1, the second via insulating layer 361 may be a component substantially the same as or similar to the via insulating layer 161 illustrated in FIG. 1, and the second pad insulating layer 350 may be a component substantially the same as or similar to the pad insulating layer 150 illustrated in FIG. 1, and thus, repeated detailed descriptions thereof may be omitted. The second semiconductor chip 300 may further include a front pad insulating layer 393 on the second interconnect structure 370, and a front bonding pad 391 buried in the front pad insulating layer 393 and electrically connected to the second interconnect pattern 371 of the second interconnect structure 370. The front bonding pad 391 may include a core metal layer 3911 and a seed metal layer 3913 extending along the sidewall and bottom surface of the core metal layer 3911. The front pad insulating layer 393 may include, e.g., silicon oxide. The lower surface of the front pad insulating layer 393 may constitute a bonding surface of the second semiconductor chip 300, and may have a bonding force suitable for bonding, through plasma treatment or wet treatment. The uppermost second semiconductor chip 300 among the plurality of second semiconductor chips 300 may not include the front pad insulating layer 393 and the front bonding pad 391. In the semiconductor package 1000, each of the plurality of second semiconductor chips 300 may be arranged such that the active surface 319 of the second semiconductor substrate 310 faces upward and the inactive surface 317 of the second semiconductor substrate 310 faces downward.

In an implementation, at least one of the first semiconductor chip 200 and the plurality of second semiconductor chips 300 may be a memory semiconductor chip. In an implementation, at least one of the first semiconductor chip 200 and the plurality of second semiconductor chips 300 may be a logic chip. The logic chip may include a central processing unit (CPU) chip, a graphics processing unit (GPU) chip, and an application processor (AP) chip.

In an implementation, the semiconductor package 1000 including the first semiconductor chip 200 and the plurality of second semiconductor chips 300 may be referred to as a high-bandwidth memory (HBM) dynamic random-access memory (DRAM) semiconductor chip. In an implementation, the first semiconductor chip 200 may be a buffer chip including a serial-parallel conversion circuit and configured to control the plurality of second semiconductor chips 300, and the plurality of second semiconductor chips 300 may be core chips including DRAM memory cells. In an implementation, the first semiconductor chip 200 may be referred to as a master chip, and each of the plurality of second semiconductor chips 300 may be referred to as a slave chip.

As illustrated in FIG. 6A, the first semiconductor chip 200 and the lowermost second semiconductor chip 300 may be bonded to each other by using a direct bonding method or a hybrid direct bonding method. The first bonding pad 240 of the first semiconductor chip 200 and the second bonding pad 340 of the lowermost second semiconductor chip 300 may be aligned with and bonded with each other in the vertical direction (e.g., the Z direction). The upper surface of the second core metal layer 2451 of the second conductive pad 245 may be in direct contact with the bottom surface of the fourth core metal layer 3451 of the fourth conductive pad 345. In an implementation, the upper surface of the second insulating layer 255 of the first semiconductor chip 200 may be in contact with the lower surface of the fourth insulating layer 355 of the second semiconductor chip 300. Each of the upper surface of the second insulating layer 255 of the first semiconductor chip 200 and the lower surface of the fourth insulating layer 355 of the second semiconductor chip 300 may have a bonding force suitable for bonding, through plasma treatment or wet treatment. In an implementation, bonding the first semiconductor chip 200 to the lowermost second semiconductor chip 300 may be performed by bringing the bonding surface of the first semiconductor chip 200 into contact with the bonding surface of the second semiconductor chip 300 and then applying heat to the bonding surfaces to the bonding surfaces to bond the first bonding pad 240 and the second insulating layer 255 of the first semiconductor chip 200 to the second bonding pad 340 and the fourth insulating layer 355 of the second semiconductor chip 300, respectively.

In an implementation, as illustrated in FIG. 6B, two second semiconductor chips 300 adjacent in the vertical direction (e.g., the Z direction) may be bonded to each other by using a direct bonding method or a hybrid direct bonding method. The front bonding pad 391 of the lower second semiconductor chip 300 among the two adjacent second semiconductor chips 300 may be aligned with and bonded to the second bonding pad 340 of the upper second semiconductor chip 300 among the two adjacent second semiconductor chips 300, in the vertical direction (e.g., the Z direction). In an implementation, the front pad insulating layer 393 of the lower second semiconductor chip 300 may be bonded to the fourth insulating layer 355 of the upper second semiconductor chip 300. Each of the surface of the front pad insulating layer 393 of the lower second semiconductor chip 300 and the surface of the fourth insulating layer 355 of the second semiconductor chip 300 may have a bonding force suitable for bonding, through plasma treatment or wet treatment. In an implementation, bonding two adjacent second semiconductor chips 300 to each other may be performed by bringing the bonding surface of the lower second semiconductor chip 300 into contact with the bonding surface of the upper second semiconductor chip 300, and then applying heat to the bonding surfaces to bond the front bonding pad 391 and the front pad insulating layer 393 of the lower second semiconductor chip 300 to the second bonding pad 340 and the fourth insulating layer 355 of the upper second semiconductor chip 300, respectively.

The semiconductor package 1000 may further include a molding layer 810, which is on the first semiconductor chip 200 and covers side surfaces of the plurality of second semiconductor chips 300. The molding layer 810 may cover a portion of the upper surface of the first semiconductor chip 200, which is not covered by the plurality of second semiconductor chips 300. In an implementation, the molding layer 810 may not cover the upper surface of the uppermost second semiconductor chip 300. In an implementation, the molding layer 810 may further cover the upper surface of the uppermost second semiconductor chip 300. The molding layer 810 may include, e.g., an epoxy mold compound (EMC).

When two semiconductor chips are bonded to each other by using a direct bonding method, delamination between insulating layers could occur at a bonding interface of the two semiconductor chips due to, e.g., shrinkage of the insulating layers at the bonding interface and expansion of bonding pads. Such delamination between insulating layers could deteriorate the reliability of bonding between semiconductor chips.

According to embodiments, while bonding between two semiconductor chips is in progress, the first bonding pad 240 having a step-like structure or the second bonding pad 340 having a step-like structure may be thermally expanded to provide each of two insulating layers constituting a bonding interface of the two semiconductor chips with an external force acting toward the bonding interface. The external force provided by thermal expansion of the first bonding pad 240 or the second bonding pad 340 may help suppress delamination between the two insulating layers constituting the bonding interface of the two semiconductor chips, and thus, the reliability of bonding between the two semiconductor chips may be improved.

Referring to FIG. 6A, when the first semiconductor chip 200 and the second semiconductor chip 300 are bonded to each other by using a direct bonding method, a portion of the first pad insulating layer 250 between the outer portion of the first conductive pad 241 and a bonding interface 601 between the first semiconductor chip 200 and the second semiconductor chip 300 may be pressed toward the bonding interface 601 by an external force provided by the outer portion of the first conductive pad 241 that is thermally expanded, and a portion of the second pad insulating layer 350 between the outer portion of the third conductive pad 341 and the bonding interface 601 may be pressed toward the bonding interface 601 by an external force provided by the outer portion of the third conductive pad 341 that is thermally expanded. While the first semiconductor chip 200 and the second semiconductor chip 300 are bonded to each other, each of the first pad insulating layer 250 and the second pad insulating layer 350 may be pressed toward the bonding interface 601, and thus, delamination between the first pad insulating layer 250 and the second pad insulating layer 350 at the bonding interface 601 may prevented and suppressed, and ultimately, the reliability of bonding between the first semiconductor chip 200 and the second semiconductor chip 300 may be improved.

In an implementation, referring to FIG. 6B, when the two second semiconductor chips 300 are bonded to each other by using a direct bonding method, a portion of the second pad insulating layer 350 between the outer portion of the third conductive pad 341 and a bonding interface 603 of the two second semiconductor chips 300 may be pressed toward the bonding interface 603 by an external force provided by the outer portion of the third conductive pad 341 that is thermally expanded. While the two second semiconductor chips 300 are bonded to each other, the second pad insulating layer 350 may be pressed toward the bonding interface 603, and thus, delamination between the second pad insulating layer 350 and the front pad insulating layer 393 at the bonding interface 603 may be prevented and suppressed, and ultimately, the reliability of bonding between the two second semiconductor chips 300 may be improved.

Figure 7:
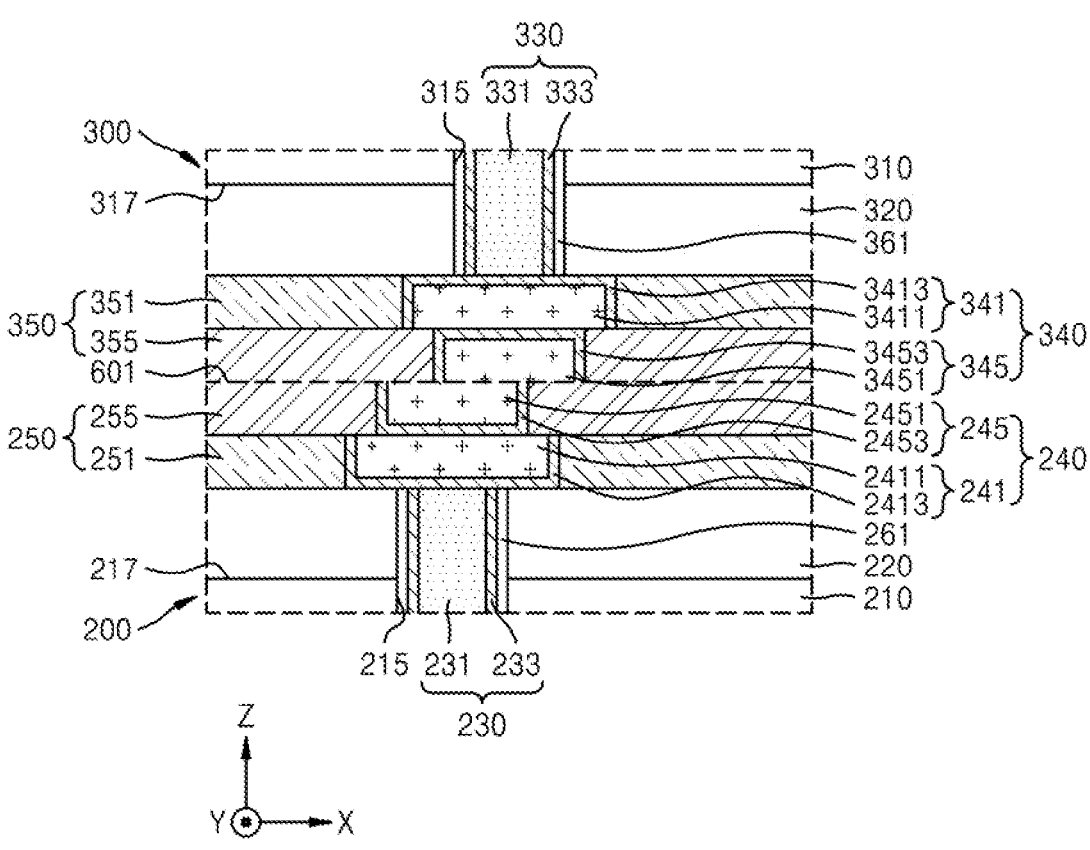
FIG. 7 is a cross-sectional view illustrating a portion of a semiconductor package according to embodiments.

FIG. 7 is a cross-sectional view illustrating a portion of a semiconductor package according to embodiments. FIG. 7 illustrates the portion of the semiconductor package corresponding to the region "VIA" in FIG. 5.

Referring to FIG. 7, the center of the upper surface of the second conductive pad 245 and the center of the lower surface of the fourth conductive pad 345 may be misaligned with each other. In an implementation, the center of the upper surface of the second conductive pad 245 and the center of the lower surface of the fourth conductive pad 345 may be spaced apart from each other in the horizontal direction (e.g., the X direction and/or the Y direction).

Figure 8:
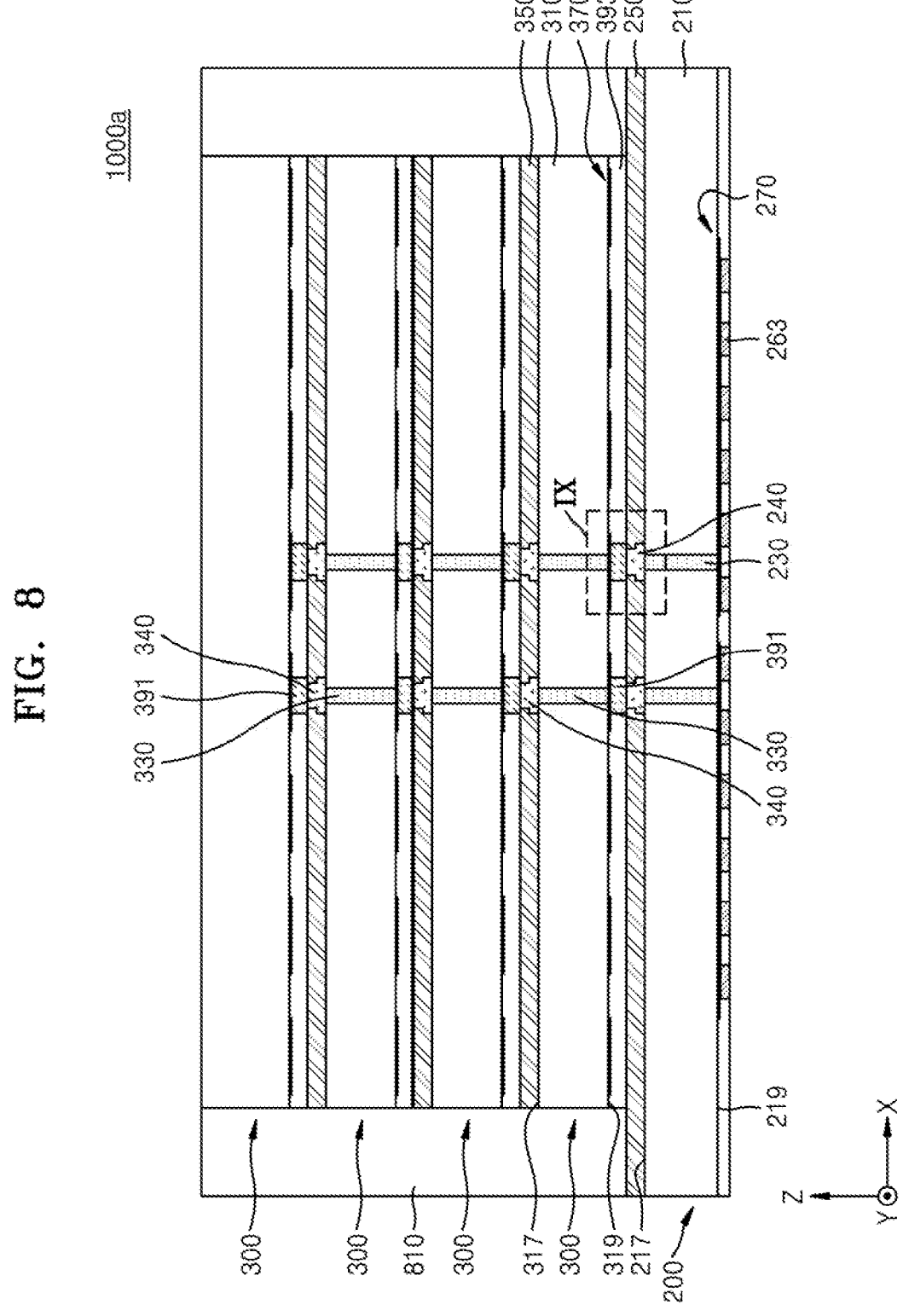
FIG. 8 is a cross-sectional view illustrating a semiconductor package according to embodiments.
Figure 9:
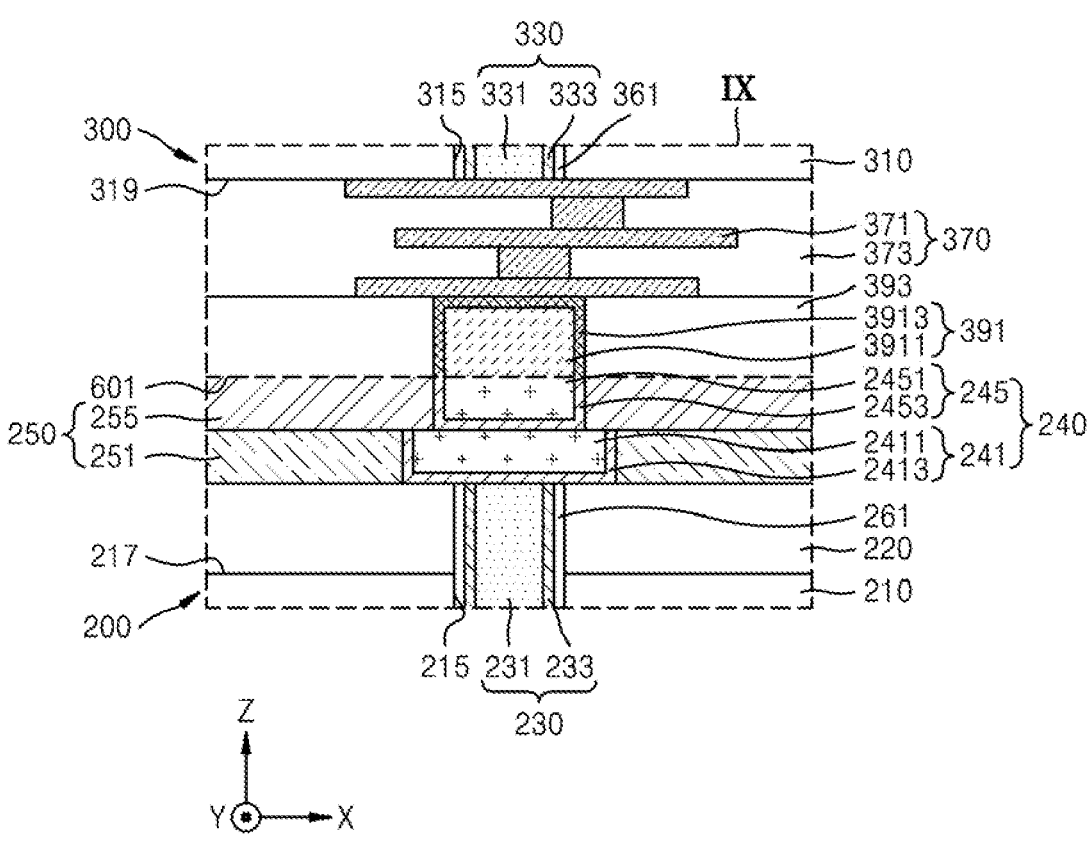
FIG. 9 is an enlarged view illustrating a region "IX" in FIG. 8.

FIG. 8 is a cross-sectional view illustrating a semiconductor package 1000a according to embodiments. FIG. 9 is an enlarged view illustrating a region "IX" in FIG. 8. Hereinafter, differences from the semiconductor package 1000 described above with reference to FIG. 5 are mainly described.

Referring to FIGS. 8 and 9, the semiconductor package 1000a may include the first semiconductor chip 200 and the plurality of second semiconductor chips 300. In the semiconductor package 1000a, each of the plurality of second semiconductor chips 300 may be arranged such that the inactive surface 317 of the second semiconductor substrate 310 faces upward and the active surface 319 of the second semiconductor substrate 310 faces downward. In an implementation, the uppermost second semiconductor chip 300 may include the front pad insulating layer 393 and the front bonding pad 391 on the active surface 319 of the second semiconductor substrate 310, but may not include the second through electrode 330.

As illustrated in FIG. 9, the first semiconductor chip 200 and the lowermost second semiconductor chip 300 may be bonded to each other by using a direct bonding method or a hybrid direct bonding method. The first bonding pad 240 of the first semiconductor chip 200 may be aligned with and bonded to the front bonding pad 391 of the second semiconductor chip 300 in the vertical direction (e.g., the Z direction). In an implementation, the second insulating layer 255 of the first semiconductor chip 200 may be bonded to the front pad insulating layer 393 of the second semiconductor chip 300. In an implementation, bonding the first semiconductor chip 200 to the lowermost second semiconductor chip 300 may be performed by bringing the bonding surface of the first semiconductor chip 200 into contact with the bonding surface of the second semiconductor chip 300 and then applying heat to the bonding surfaces to bond the first bonding pad 240 and the second insulating layer 255 of the first semiconductor chip 200 to the front bonding pad 391 and the front pad insulating layer 393 of the second semiconductor chip 300, respectively.

Figure 10:
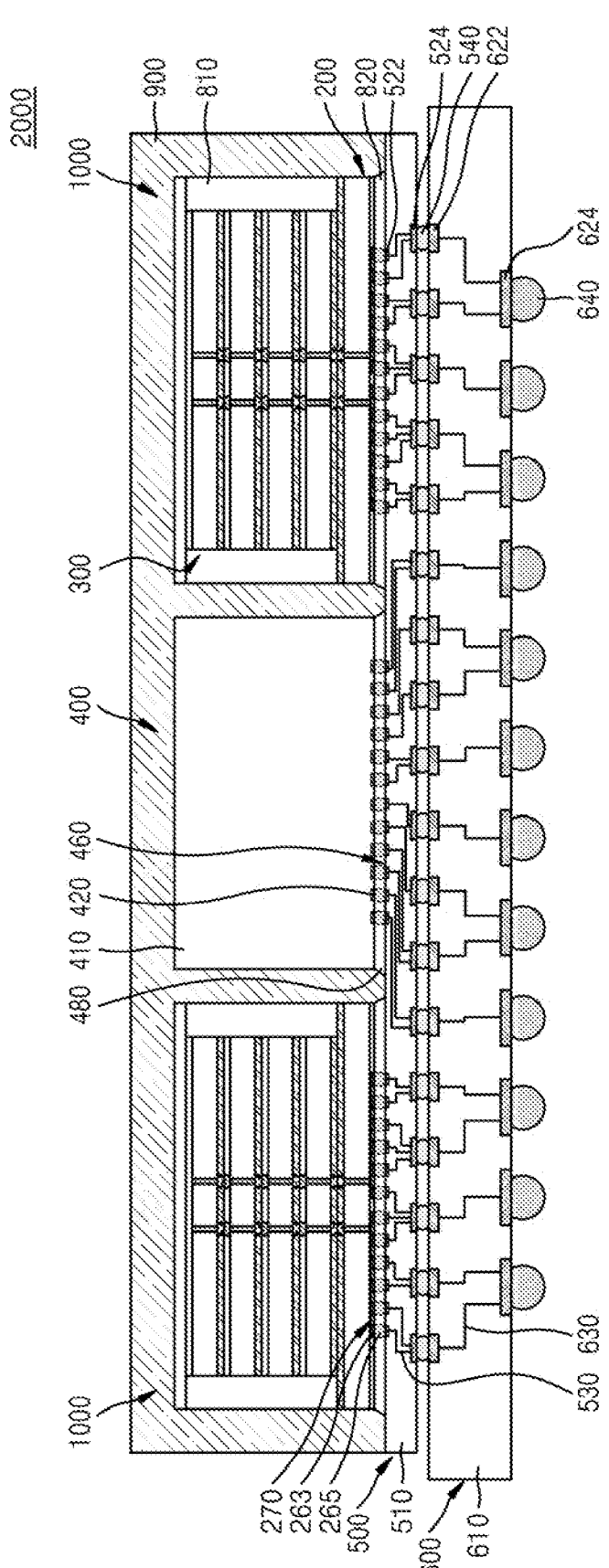
FIG. 10 is a cross-sectional view illustrating a semiconductor package according to embodiments.

FIG. 10 is a cross-sectional view illustrating a semiconductor package 2000 according to embodiments.

Referring to FIG. 10, the semiconductor package 2000 may include a main board 600 with an interposer 500 mounted thereon, at least one sub-semiconductor package 1000 attached to the interposer 500 and including the first semiconductor chip 200 and the plurality of second semiconductor chips 300, and a third semiconductor chip 400. FIG. 10 illustrates that the sub-semiconductor package 1000 corresponds to the semiconductor package 1000 illustrated in FIG. 5. In an implementation, the sub-semiconductor package 1000 may be the semiconductor package 1000a illustrated in FIG. 8. The sub-semiconductor package 1000 is described with reference to FIG. 5. Also, the semiconductor package 2000 may be referred to as a system.

The sub-semiconductor package 1000 may be attached to the interposer 500 through a plurality of first connection bumps 265. The plurality of first connection bumps 265 may be attached to the plurality of first connection pads 263 to be electrically connected to the first interconnect structure 270 of the first semiconductor chip 200. The plurality of first connection bumps 265 may provide at least one of a signal, power, and ground for the sub-semiconductor package 1000.

In an implementation, as illustrated in FIG. 10, the semiconductor package 2000 may include two sub-semiconductor packages 1000. In an implementation, the semiconductor package 2000 may include one sub-semiconductor package 1000 or three or more sub-semiconductor packages 1000.

The third semiconductor chip 400 may include a third semiconductor substrate 410 having a semiconductor device formed on the active surface thereof, and a plurality of connection pads 420. In an implementation, each of the plurality of connection pads 420 may include, e.g., aluminum, copper, or nickel. The third semiconductor chip 400 may be attached to the interposer 500 through a plurality of second connection bumps 460. The plurality of second connection bumps 460 may be attached to the plurality of connection pads 420. The third semiconductor chip 400 may be a logic chip. In an implementation, the third semiconductor chip 400 may be a CPU chip, a GPU chip, or an AP chip.

The third semiconductor substrate 410 may be a component substantially similar to the first semiconductor substrate 210 or the second semiconductor substrate 310 illustrated in FIG. 5, and the second connection bump 460 may be a component similar to the first connection bump 265, and thus, repeated detailed descriptions thereof may be omitted.

The interposer 500 may include a base layer 510, a plurality of first upper surface pads 522 and a plurality of first lower surface pads 524 respectively on the upper surface and the lower surface of the base layer 510, and a plurality of first interconnect paths 530 electrically connecting the plurality of first upper surface pads 522 to the plurality of first lower surface pads 524 through the base layer 510. The base layer 510 may include a semiconductor, glass, ceramic, or plastic. In an implementation, the base layer 510 may include silicone. The plurality of first interconnect paths 530 may include interconnect layers connected, on the upper surface or lower surface of the base layer 510, to the plurality of first upper surface pads 522 or the plurality of first lower surface pads 524, or internal through electrodes provided in the base layer 510 to electrically connect the plurality of first upper surface pads 522 to the plurality of first lower surface pads 524. The plurality of first connection bumps 265 electrically connecting the sub-semiconductor packages 1000 to the interposer 500, or the plurality of second connection bumps 460 electrically connecting the third semiconductor chip 400 to the interposer 500 may be connected to the plurality of first upper surface pads 522.

A first underfill layer 820 may be between the sub-semiconductor package 1000 and the interposer 500, and a second underfill layer 480 may be between the third semiconductor chip 400 and the interposer 500. The first underfill layer 820 may surround the plurality of first connection bumps 265, and the second underfill layer 480 may surround the plurality of second connection bumps 460.

The semiconductor package 2000 may further include a package molding layer 900 on the interposer 500 and surrounding the sub-semiconductor packages 1000 and side surfaces of the third semiconductor chip 400. The package molding layer 900 may include, e.g., an EMC. In an implementation, the package molding layer 900 may cover the upper surfaces of the sub-semiconductor packages 1000 and the third semiconductor chip 400. In some embodiments, the package molding layer 900 may not cover the upper surfaces of the sub-semiconductor packages 1000 and the third semiconductor chip 400. In an implementation, a heat dissipation member may be attached to the sub-semiconductor packages 1000 and the third semiconductor chip 400 with a thermal interface material (TIM) therebetween.

A plurality of board connection terminals 540 may be attached to the plurality of first lower surface pads 524. The plurality of board connection terminals 540 may electrically connect the interposer 500 to the main board 600.

The main board 600 may include a base board layer 610, a plurality of second upper surface pads 622 and a plurality of second lower surface pads 624 respectively on the upper surface and the lower surface of the base board layer 610, and a plurality of second interconnect paths 630 electrically connecting the plurality of second upper surface pads 622 to the plurality of second lower surface pads 624 through the base board layer 610.

In an implementation, the main board 600 may be a printed circuit board. In an implementation, the main board 600 may be a multilayer printed circuit board. The base board layer 610 may include, e.g., phenol resin, epoxy resin, or polyimide.

Solder resist layers respectively exposing the plurality of second upper surface pads 622 and the plurality of second lower surface pads 624 may be formed on the upper surface and the lower surface of the base board layer 610, respectively. The plurality of board connection terminals 540 may be connected to the plurality of second upper surface pads 622, and a plurality of external connection terminals 640 may be connected to the plurality of second lower surface pads 624. The plurality of board connection terminals 540 may electrically connect the plurality of first lower surface pads 524 to the plurality of second upper surface pads 622. The plurality of external connection terminals 640 connected to the plurality of second lower surface pads 624 may electrically and physically connect the semiconductor package 2000 to an external device.

In an implementation, the semiconductor package 2000 may not include the main board 600, and the plurality of board connection terminals 540 of the interposer 500 may function as external connection terminals.

Figure 11:
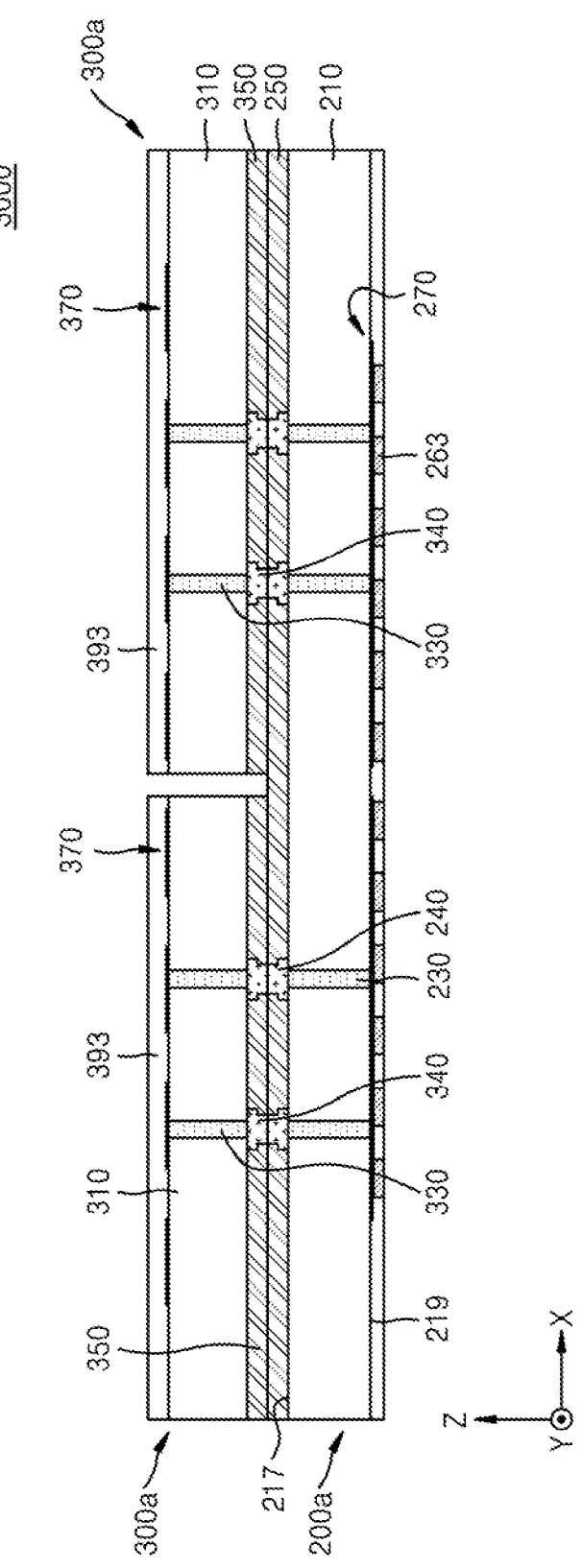
FIG. 11 is a cross-sectional view illustrating a semiconductor package according to embodiments.

FIG. 11 is a cross-sectional view illustrating a semiconductor package 3000 (hereinafter, also referred to as the sub-semiconductor package 3000) according to embodiments. Hereinafter, descriptions as those given above are omitted.

Referring to FIG. 11, the semiconductor package 3000 may include a first semiconductor chip 200a and a plurality of second semiconductor chips 300a. The plurality of second semiconductor chips 300a may be stacked on the first semiconductor chip 200a, and may be arranged side-by-side on the upper surface of the first semiconductor chip 200a. In an implementation, as illustrated in FIG. 11, two second semiconductor chips 300a may be stacked on the first semiconductor chip 200a, and three or more second semiconductor chips 300a may be arranged side-by-side on the first semiconductor chip 200a. In an implementation, the semiconductor package 3000 may include one or more second semiconductor chips 300a stacked on two or more first semiconductor chips 200a spaced apart from each other in the horizontal direction. In an implementation, all of the plurality of second semiconductor chips 300a may be of the same type of semiconductor chip. In an implementation, the plurality of second semiconductor chips 300a may include different types of semiconductor chips. Each of the plurality of second semiconductor chips 300a and the first semiconductor chip 200a may be bonded to each other by using a direct bonding method. Bonding between each of the plurality of second semiconductor chips 300a and the first semiconductor chip 200a may be similar to the bonding between the first semiconductor chip 200 and the lowermost second semiconductor chip 300 of FIG. 5, and thus, a repeated detailed description thereof may be omitted.

Figure 12:
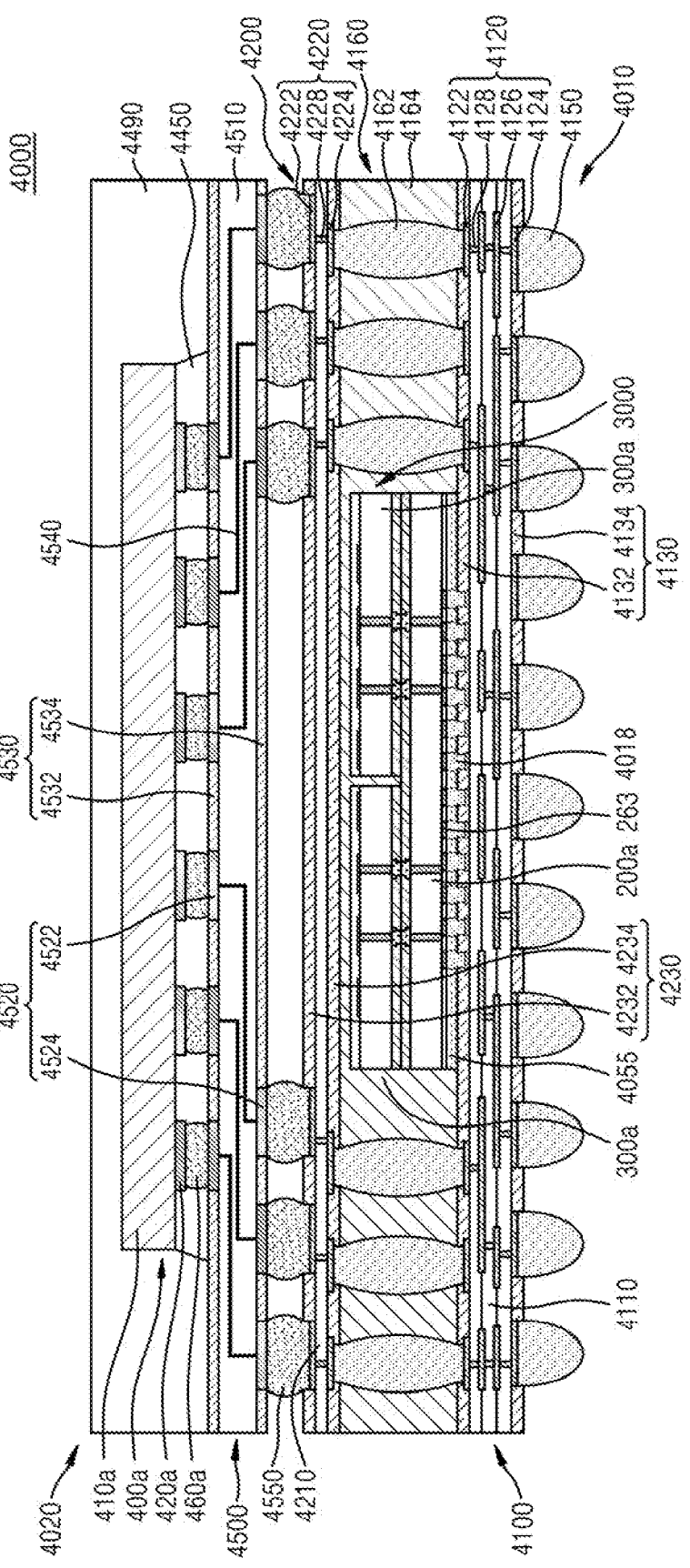
FIG. 12 is a cross-sectional view illustrating a semiconductor package according to embodiments.

FIG. 12 is a cross-sectional view illustrating a semiconductor package 4000 according to embodiments.

Referring to FIG. 12, the semiconductor package 4000 includes an upper semiconductor package 4020 stacked on a lower semiconductor package 4010. The semiconductor package 4000 may have a package-on-package structure.

The lower semiconductor package 4010 may include a support interconnect structure 4100, an expanded layer 4160 on the support interconnect structure 4100, the sub-semiconductor package 3000 in the expanded layer 4160, and a cover interconnect structure 4200 on the expanded layer 4160. The sub-semiconductor package 3000 may be the semiconductor package 3000 illustrated in FIG. 11.

The lower semiconductor package 4010 may be a fan-out semiconductor package in which the horizontal width and the planar area of the support interconnect structure 4100 and the horizontal width and the planar area of the cover interconnect structure 4200 are greater than the horizontal width and the planar area of the sub-semiconductor package 3000, respectively. In an implementation, the horizontal widths and the planar areas of the support interconnect structure 4100 and the cover interconnect structure 4200 may be equal to each other, respectively. In an implementation, corresponding side surfaces of the support interconnect structure 4100, the expanded layer 4160, and the cover interconnect structure 4200 may be coplanar with each other.

The support interconnect structure 4100 may be referred to as a lower interconnect structure, and the cover interconnect structure 4200 may be referred to as an upper interconnect structure.

The support interconnect structure 4100 and the cover interconnect structure 4200 may be, e.g., printed circuit boards, ceramic substrates, wafers for fabricating a package, or interposers. In an implementation, the support interconnect structure 4100 and the cover interconnect structure 4200 may be multilayer printed circuit boards. In a case in which the support interconnect structure 4100 is a printed circuit board, the support interconnect structure 4100 may also be referred to as a support printed circuit board, a lower printed circuit board, or a first printed circuit board. In a case in which the cover interconnect structure 4200 is a printed circuit board, the cover interconnect structure 4200 may also be referred to as a cover printed circuit board, an upper printed circuit board, or a second printed circuit board.

The support interconnect structure 4100 may include at least one first base insulating layer 4110 and a plurality of first interconnect patterns 4120. The cover interconnect structure 4200 may include at least one second base insulating layer 4210 and a plurality of second interconnect patterns 4220. The first base insulating layer 4110 and the second base insulating layer 4210 may include, e.g., a phenol resin, an epoxy resin, or a polyimide.

The plurality of first interconnect patterns 4120 may include a first upper surface interconnect pattern, which is on the upper surface of the at least one first base insulating layer 4110 and includes a plurality of first upper surface pads 4122, a first lower surface interconnect pattern, which is on the lower surface of the at least one first base insulating layer 4110 and includes a plurality of first lower surface pads 4124, and a plurality of first conductive vias 4128, which penetrate the at least one first base insulating layer 4110 and electrically connect the first interconnect patterns 4120 in different interconnect layers to each other. In an implementation, in a case in which the support interconnect structure 4100 includes a plurality of first base insulating layers 4110, the first interconnect pattern 4120 may further include a first internal interconnect pattern 4126 that forms an interconnect layer between two adjacent first base insulating layers 4110.

The plurality of second interconnect patterns 4220 may include a second upper surface interconnect pattern, which is on the upper surface of the at least one second base insulating layer 4210 and includes a plurality of second upper surface pads 4222, a second lower surface interconnect pattern, which is on the lower surface of the at least one second base insulating layer 4210 and includes a plurality of second lower surface pads 4224, and a plurality of second conductive vias 4228, which penetrate the at least one second base insulating layer 4210 and electrically connect the second interconnect patterns 4220 in different interconnect layers to each other. The first interconnect pattern 4120 and the second interconnect pattern 4220 may include copper, nickel, stainless steel, or beryllium copper.

The support interconnect structure 4100 may further include first solder resist layers 4130 respectively on the upper and lower surfaces thereof. The first solder resist layers 4130 may include a first upper surface solder resist layer 4132 covering the upper surface of the at least one first base insulating layer 4110 and exposing the first upper surface pad 4122, and a first lower surface solder resist layer 4134 covering the lower surface of the at least one first base insulating layer 4110 and exposing the first lower surface pad 4124. In an implementation, the first lower surface solder resist layer 4134 may be formed, but the first upper surface solder resist layer 4132 may not be formed.

The cover interconnect structure 4200 may further include second solder resist layers 4230 respectively on the upper and lower surfaces thereof. The second solder resist layers 4230 may include a second upper surface solder resist layer 4232 having an opening for covering the upper surface of the at least one second base insulating layer 4210 and exposing the second upper surface pad 4222, and a second lower surface solder resist layer 4234 having an opening for covering the lower surface of the at least one second base insulating layer 4210 and exposing the second lower surface pad 4224.

A plurality of first chip connection terminals 4018 may be between the plurality of first upper surface pads 4122 and the plurality of first connection pads 263, to electrically connect the sub-semiconductor package 3000 to the support interconnect structure 4100. In an implementation, the plurality of first chip connection terminals 4018 may be solder balls or bumps. In an implementation, an underfill layer 4055 surrounding the plurality of first chip connection terminals 4018 may be between the sub-semiconductor package 3000 and the support interconnect structure 4100. In embodiments, the underfill layer 4055 may be a non-conductive film (NCF).

The semiconductor package 4000 may include a plurality of external connection terminals 4150 attached to the plurality of first lower surface pads 4124. In an implementation, the height of each of the plurality of external connection terminals 4150 may be about 150 μm. In an implementation, the plurality of external connection terminals 4150 may be solder balls.

The expanded layer 4160 may include a plurality of connection structures 4162, and a filling member 4164 surrounding the plurality of connection structures 4162 and the sub-semiconductor package 3000. The filling member 4164 may fill a space between the support interconnect structure 4100 and the cover interconnect structure 4200, and surround the sub-semiconductor package 3000. The plurality of connection structures 4162 may be spaced apart from the sub-semiconductor package 3000, and may be around the sub-semiconductor package 3000. The plurality of connection structures 4162 may penetrate the filling member 4164 to electrically connect the support interconnect structure 4100 to the cover interconnect structure 4200. The upper and lower ends of each of the plurality of connection structures 4162 may be in contact with and connected to any one of the plurality of second lower surface pads 4224 of the cover interconnect structure 4200, and any one of the plurality of first upper surface pads 4122 of the support interconnect structure 4100.

The upper semiconductor package 4020 may include at least one third semiconductor chip 400a. The upper semiconductor package 4020 may be electrically connected to the lower semiconductor package 4010 through a plurality of package connection terminals 4550 attached to the plurality of second upper surface pads 4222 of the lower semiconductor package 4010.

The third semiconductor chip 400a may include a third semiconductor substrate 410a having a semiconductor device formed on the active surface thereof, and a plurality of chip connection pads 420a on the active surface of the third semiconductor substrate 410a. The at least one third semiconductor chip 400a may be a memory semiconductor chip.

In an implementation, as illustrated in FIG. 12, the at least one third semiconductor chip 400a included in the upper semiconductor package 4020 may be mounted on a package base substrate 4500 in a flip-chip manner. In an implementation, the semiconductor package 4000 may include, as an upper semiconductor package, a suitable type of semiconductor package including the at least one third semiconductor chip 400a, and to the lower side of which the package connection terminal 4550 may be attached to electrically connect the semiconductor package 4000 to the lower semiconductor package 4010.

The package base substrate 4500 may include a base board layer 4510 and a plurality of board pads 4520 on the upper and lower surfaces of the base board layer 4510. The plurality of board pads 4520 may include a plurality of board upper surface pads 4522 on the upper surface of the base board layer 4510 and a plurality of board lower surface pads 4524 on the lower surface of the base board layer 4510. In an implementation, the package base substrate 4500 may be a printed circuit board. Board solder resist layers 4530 exposing the plurality of board pads 4520 may be formed on the upper and lower surfaces of the base board layer 4510. The board solder resist layers 4530 may include an upper surface board solder resist layer 4532 covering the upper surface of the base board layer 4510 and exposing the plurality of board upper surface pads 4522, and a lower surface board solder resist layer 4534 covering the lower surface of the base board layer 4510 and exposing the plurality of board lower surface pads 4524.

The package base substrate 4500 may include board interconnects 4540 electrically connecting, within the base board layer 4510, the plurality of board upper surface pads 4522 to the plurality of board lower surface pads 4524. The board interconnect 4540 may include a board interconnect line and a board interconnect via.

The plurality of board upper surface pads 4522 may be electrically connected to the third semiconductor chip 400a. In an implementation, a plurality of second chip connection terminals 460a may be between the plurality of chip connection pads 420a of the third semiconductor chip 400a and the plurality of board upper surface pads 4522 of the package base substrate 4500, to electrically connect the third semiconductor chip 400a to the package base substrate 4500. In an implementation, a second underfill layer 4450 surrounding the plurality of second chip connection terminals 460a may be between the third semiconductor chip 400a and the package base substrate 4500. The second underfill layer 4450 may include, e.g., epoxy resin formed by a capillary underfill method.

A molding layer 4490 surrounding the third semiconductor chip 400a may be on the package base substrate 4500. The molding layer 4490 may include, e.g., an EMC.

Figure 13:
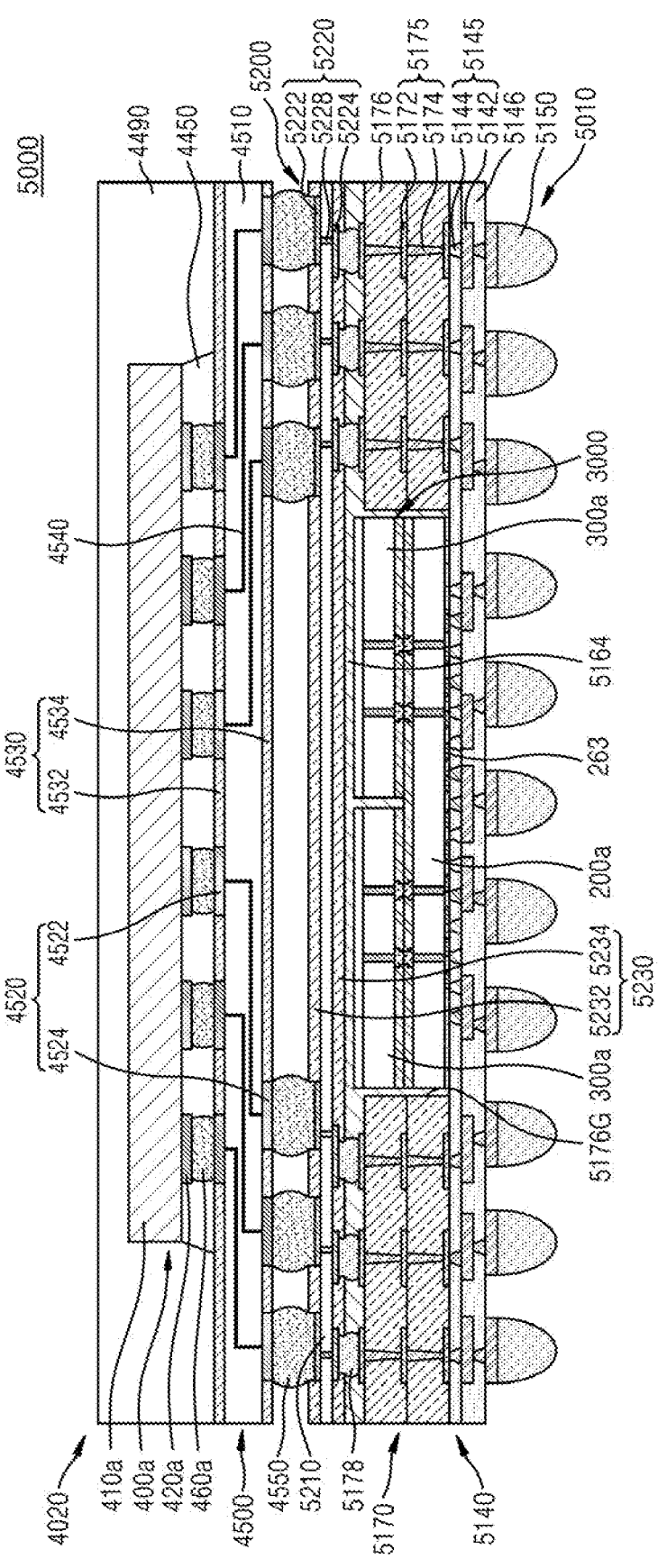
FIG. 13 is a cross-sectional view illustrating a semiconductor package according to embodiments.

FIG. 13 is a cross-sectional view illustrating a semiconductor package 5000 according to embodiments.

Referring to FIG. 13, the semiconductor package 5000 may include the upper semiconductor package 4020 stacked on a lower semiconductor package 5010. The upper semiconductor package 4020 may be substantially the same as the upper semiconductor package 4020 described above with reference to FIG. 12, and thus, a repeated detailed description thereof may be omitted.

The lower semiconductor package 5010 may include a support interconnect structure 5140, an expanded layer 5170 on the support interconnect structure 5140 and having a mounting space 5176G therein, the sub-semiconductor package 3000 in the mounting space 5176G of the expanded layer 5170, and a cover interconnect structure 5200 on the expanded layer 5170. The expanded layer 5170 may surround the sub-semiconductor package 3000. The sub-semiconductor package 3000 may be the semiconductor package 3000 illustrated in FIG. 11.

The lower semiconductor package 5010 may be a fan-out semiconductor package. In an implementation, the expanded layer 5170 may be a panel board, and the lower semiconductor package 5010 may be a fan-out panel level package (FOPLP). In an implementation, the lower semiconductor package 5010 may be a chip-first FOPLP formed by attaching the cover interconnect structure 5200 on the expanded layer 5170 and then forming the support interconnect structure 5140. The support interconnect structure 5140 may be referred to as a redistribution layer.

In an implementation, the horizontal width and the planar area of the mounting space 5176G may be greater than the horizontal width and the planar area of a footprint constituted by the sub-semiconductor package 3000, respectively. The side surfaces of the sub-semiconductor package 3000 may be spaced apart from the inner surface of the mounting space 5176G.

The support interconnect structure 5140 may include a redistribution conductive structure 5145 and a plurality of redistribution insulating layers 5146. The redistribution conductive structure 5145 and the redistribution insulating layer 5146 may be referred to as an interconnect pattern and a base insulating layer, respectively. The redistribution conductive structure 5145 may include a plurality of redistribution line patterns 5142 on at least one of the upper and lower surfaces of each of the plurality of redistribution insulating layers 5146, and a plurality of redistribution vias 5144 penetrating at least one of the plurality of redistribution insulating layers 5146 to be in contact with and connected to some of the plurality of redistribution line patterns 5142, respectively. In an implementation, at least some of the plurality of redistribution line patterns 5142 may be formed together with some of the plurality of redistribution vias 5144, so as to constitute one body. In an implementation, the plurality of redistribution vias 5144 may have a tapered shape, such that the horizontal width thereof narrows from the lower side to the upper side. In an implementation, the horizontal width of the plurality of redistribution vias 5144 may become narrower toward the first semiconductor chip 200a. The plurality of first connection pads 263 of the sub-semiconductor package 3000 may be electrically connected to the redistribution conductive structure 5145.

The expanded layer 5170 may be, e.g., a printed circuit board, a ceramic substrate, a wafer for fabricating a package, or an interposer. In an implementation, the expanded layer 5170 may be a multilayer printed circuit board. The mounting space 5176G may be an opening or a cavity in the expanded layer 5170. The mounting space 5176G may be in a partial region of the expanded layer 5170, e.g., a central region. The mounting space 5176G may be recessed from the upper surface of the expanded layer 5170 to a preset depth, or may extend from the upper surface to the lower surface of the expanded layer 5170 to be opened. The expanded layer 5170 may include a plurality of connection structures 5175 and at least one substrate base 5176. The connection structure 5175 may include a connection interconnect pattern 5172 and a connection conductive via 5174.

The lower semiconductor package 5010 may further include a filling member 5164 filling a space between the sub-semiconductor package 3000 and the expanded layer 5170 and a space between the expanded layer 5170 and the cover interconnect structure 5200. The filling member 5164 may surround the sub-semiconductor package 3000. The filling member 5164 may include, e.g., an EMC.

The cover interconnect structure 5200 including a plurality of second interconnect pattern 5220 electrically connected to the connection structure 5175 may be on the expanded layer 5170. The cover interconnect structure 5200 may include at least one second base insulating layer 5210 and the plurality of second interconnect patterns 5220. The plurality of second interconnect patterns 5220 may include a second upper surface interconnect pattern, which is on the upper surface of the at least one second base insulating layer 5210 and includes a plurality of second upper surface pads 5222, a second lower surface interconnect pattern, which is on the lower surface of the at least one second base insulating layer 5210 and includes a plurality of second lower surface pads 5224, and a plurality of second conductive vias 5228, which penetrate the at least one second base insulating layer 5210 and electrically connect the second interconnect patterns 5220 in different interconnect layers. In an implementation, a plurality of internal connection terminals 5178 may be between the connection structure 5175 and the plurality of second lower surface pads 5224 to electrically connect the connection structure 5175 to the second interconnect pattern 5220.

One or more embodiments may provide a semiconductor chip and a semiconductor package including stacked semiconductor chips.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor chip, comprising:
a semiconductor substrate;
a through electrode penetrating the semiconductor substrate;
a bonding pad including:
a first conductive pad connected to the through electrode, and
a second conductive pad on a central portion of the first conductive pad, an outer portion of the first conductive pad protruding outwardly relative to a sidewall of the second conductive pad; and
a pad insulating layer on the semiconductor substrate and surrounding a sidewall of the first conductive pad and the sidewall of the second conductive pad,
wherein the first conductive pad includes:
a first core metal layer; and
a first seed metal layer between a sidewall of the first core metal layer and the pad insulating layer and between a bottom surface of the first core metal layer and the through electrode.

2. The semiconductor chip as claimed in claim 1, wherein the outer portion of the first conductive pad has a ring shape continuously extending around the sidewall of the second conductive pad in a plan view.

3. The semiconductor chip as claimed in claim 1, wherein the second conductive pad includes:
a second core metal layer; and
a second seed metal layer between a sidewall of the second core metal layer and the pad insulating layer and between a bottom surface of the second core metal layer and the first conductive pad.

4. The semiconductor chip as claimed in claim 1, wherein the pad insulating layer includes:
a first insulating layer surrounding the sidewall of the first conductive pad; and
a second insulating layer on the first insulating layer and surrounding the sidewall of the second conductive pad.

5. The semiconductor chip as claimed in claim 4, wherein a material of the first insulating layer is different from a material of the second insulating layer.

6. The semiconductor chip as claimed in claim 5, wherein:
the first insulating layer includes silicon nitride, and
the second insulating layer includes silicon oxide.

7. The semiconductor chip as claimed in claim 4, wherein a material of the first insulating layer is the same as a material of the second insulating layer.

8. The semiconductor chip as claimed in claim 1, wherein a length by which the outer portion of the first conductive pad protrudes laterally from the sidewall of the second conductive pad is about 1 μm to about 5 μm.

9. A semiconductor package, comprising:
a first semiconductor substrate including a first surface and a second surface, which are opposite to each other;
a first through electrode penetrating the first semiconductor substrate;
a first bonding pad including:
a first conductive pad on the first surface of the first semiconductor substrate and connected to the first through electrode, and
a second conductive pad on a central portion of the first conductive pad, an outer portion of the first conductive pad protruding outwardly relative to a sidewall of the second conductive pad;
a first pad insulating layer on the first surface of the first semiconductor substrate and surrounding a sidewall of the first conductive pad and the sidewall of the second conductive pad;

25 a second semiconductor substrate on the first pad insulating layer;

a second through electrode penetrating the second semiconductor substrate;

a second bonding pad bonded to the first bonding pad and electrically connecting the second through electrode to the first bonding pad; and a second pad insulating layer between the second semiconductor substrate and the first pad insulating layer and surrounding a sidewall of the second bonding pad, wherein the second bonding pad includes:

a third conductive pad connected to the second through electrode; and a fourth conductive pad between the third conductive pad and the second conductive pad and bonded to the second conductive pad, wherein a central portion of the third conductive pad vertically overlaps the fourth conductive pad, and wherein an outer portion of the third conductive pad protrudes outwardly relative to a sidewall of the fourth conductive pad.

10. The semiconductor package as claimed in claim 9, wherein:

the outer portion of the first conductive pad has a ring shape continuously extending around the sidewall of the second conductive pad in a plan view, and the outer portion of the third conductive pad has a ring shape continuously extending around the sidewall of the fourth conductive pad in a plan view.

11. The semiconductor package as claimed in claim 9, wherein:

the first conductive pad includes:

a first core metal layer; and a first seed metal layer between a sidewall of the first core metal layer and the first pad insulating layer and between a bottom surface of the first core metal layer and the first through electrode, and the second conductive pad includes:

a second core metal layer; and a second seed metal layer between a sidewall of the second core metal layer and the first pad insulating layer and between a bottom surface of the second core metal layer and the first conductive pad.

12. The semiconductor package as claimed in claim 11, wherein:

the third conductive pad includes:

a third core metal layer; and a third seed metal layer between a sidewall of the third core metal layer and the second pad insulating layer and between an upper surface of the third core metal layer and the second through electrode, the fourth conductive pad includes:

a fourth core metal layer; and a fourth seed metal layer between a sidewall of the fourth core metal layer and the second pad insulating layer and between an upper surface of the fourth core metal layer and the third conductive pad, and an upper surface of the second core metal layer is in direct contact with a bottom surface of the fourth core metal layer.

13. The semiconductor package as claimed in claim 9, wherein:

the first pad insulating layer includes:

a first insulating layer surrounding the sidewall of the first conductive pad; and

a second insulating layer on the first insulating layer and surrounding the sidewall of the second conductive pad, and the second pad insulating layer includes:

a third insulating layer surrounding a sidewall of the third conductive pad; and a fourth insulating layer between the second insulating layer and the third insulating layer and surrounding the sidewall of the fourth conductive pad.

14. The semiconductor package as claimed in claim 13, wherein:

the first insulating layer and the third insulating layer each include silicon nitride, and the second insulating layer and the fourth insulating layer each include silicon oxide.

15. The semiconductor package as claimed in claim 13, wherein the first insulating layer, the second insulating layer, the third insulating layer, and the fourth insulating layer each include silicon oxide.

16. The semiconductor package as claimed in claim 9, wherein each of the first conductive pad and the second conductive pad has a rectangular shape in a cross-sectional view.

17. A semiconductor package comprising a first semiconductor chip and a second semiconductor chip, which are bonded to each other, wherein:

the first semiconductor chip includes:

a first semiconductor substrate including a first surface and a second surface, which are opposite to each other;

a first through electrode penetrating the first semiconductor substrate;

a first bonding pad including a first conductive pad on the first surface of the first semiconductor substrate and connected to the first through electrode, and a second conductive pad on a central portion of the first conductive pad, an outer portion of the first conductive pad protruding outwardly relative to a sidewall of the second conductive pad; and a first pad insulating layer on the first surface of the first semiconductor substrate and surrounding a sidewall of the first conductive pad and the sidewall of the second conductive pad, the second semiconductor chip includes:

a second semiconductor substrate;

a second through electrode penetrating the second semiconductor substrate;

a second bonding pad bonded to the first bonding pad and including a third conductive pad connected to the second through electrode, and a fourth conductive pad between the third conductive pad and the second conductive pad, an outer portion of the third conductive pad protruding outwardly relative to a sidewall of the fourth conductive pad; and a second pad insulating layer between the second semiconductor substrate and the first pad insulating layer and surrounding a sidewall of the second bonding pad, the outer portion of the first conductive pad has a ring shape continuously extending around the sidewall of the second conductive pad in a plan view, the outer portion of the third conductive pad has a ring shape continuously extending around the sidewall of the fourth conductive pad in a plan view, a portion of the first pad insulating layer is between a bonding interface between the first semiconductor chip and the second semiconductor chip, and the outer portion of the first conductive pad, a portion of the second pad insulating layer is between the bonding interface and the outer portion of the third conductive pad, and each of the first conductive pad, the second conductive pad, the third conductive pad, and the fourth conductive pad has a rectangular shape in a cross-sectional view.

18. The semiconductor package as claimed in claim 17, wherein:

the first conductive pad includes:

a first core metal layer; and a first seed metal layer between a sidewall of the first core metal layer and the first pad insulating layer and between a bottom surface of the first core metal layer and the first through electrode, the second conductive pad includes:

a second core metal layer; and a second seed metal layer between a sidewall of the second core metal layer and the first pad insulating layer and between a bottom surface of the second core metal layer and the first conductive pad, the third conductive pad includes:

a third core metal layer; and a third seed metal layer between a sidewall of the third core metal layer and the second pad insulating layer and between an upper surface of the third core metal layer and the second through electrode, the fourth conductive pad includes:

a fourth core metal layer; and a fourth seed metal layer between a sidewall of the fourth core metal layer and the second pad insulating layer and between an upper surface of the fourth core metal layer and the third conductive pad, and an upper surface of the second core metal layer is in direct contact with a bottom surface of the fourth core metal layer.

\* \* \* \* \*